United States Patent
Harada et al.

(10) Patent No.: US 11,434,564 B2
(45) Date of Patent: Sep. 6, 2022

(54) METHOD OF MANUFACTURING SEMICONDUCTOR DEVICE, SUBSTRATE PROCESSING APPARATUS, RECORDING MEDIUM AND METHOD OF PROCESSING SUBSTRATE

(71) Applicant: KOKUSAI ELECTRIC CORPORATION, Tokyo (JP)

(72) Inventors: Kazuhiro Harada, Toyama (JP); Shintaro Kogura, Toyama (JP); Masayoshi Minami, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/987,065

(22) Filed: Aug. 6, 2020

(65) Prior Publication Data
US 2021/0040609 A1   Feb. 11, 2021

(30) Foreign Application Priority Data
Aug. 7, 2019   (JP) .............................. JP2019-145220

(51) Int. Cl.
    *H01L 21/02*   (2006.01)
    *C23C 16/44*   (2006.01)
    *C23C 16/30*   (2006.01)

(52) U.S. Cl.
    CPC ........ *C23C 16/4404* (2013.01); *C23C 16/308* (2013.01); *H01L 21/0228* (2013.01); *H01L 21/02126* (2013.01)

(58) Field of Classification Search
    None
    See application file for complete search history.

(56) References Cited

U.S. PATENT DOCUMENTS

| | | | |
|---|---|---|---|
| 8,895,457 B2 | 11/2014 | Akae et al. | |
| 2013/0017685 A1 | 1/2013 | Akae et al. | |
| 2019/0177849 A1* | 6/2019 | Mo .................. | C23C 16/45525 |

FOREIGN PATENT DOCUMENTS

| | | | |
|---|---|---|---|
| JP | 2007-201406 A | 8/2007 | |
| JP | 2013-007121 A | 1/2013 | |
| | (Continued) | | |

OTHER PUBLICATIONS

Japanese Office Action dated Sep. 14, 2021 for Japanese Patent Application No. 2019-145220.
(Continued)

*Primary Examiner* — Asok K Sarkar
(74) *Attorney, Agent, or Firm* — Volpe Koenig

(57) ABSTRACT

There is included (a) forming a film on a substrate by supplying a first processing gas to the substrate in a process container; (b) forming a first pre-coated film, which has a first thickness and has a material different from a material of the film formed in (a), in the process container by supplying a second processing gas into the process container in a state in which the substrate does not exist in the process container; and (c) forming a second pre-coated film, which has a second thickness smaller than the first thickness and has the same material as the material of the film formed in (a), on the first pre-coated film formed in the process container by supplying a third processing gas into the process container in the state in which the substrate does not exist in the process container.

20 Claims, 10 Drawing Sheets

(56) References Cited

FOREIGN PATENT DOCUMENTS

| JP | 2017-098543 A | 6/2017 |
| TW | 201142950 A | 12/2011 |
| WO | 2011/111498 A1 | 9/2011 |

OTHER PUBLICATIONS

Taiwanese Office Action dated Sep. 29, 2021 for Taiwanese Patent Application No. 109126141.

* cited by examiner

METHOD OF MANUFACTURING SEMICONDUCTOR DEVICE, SUBSTRATE PROCESSING APPARATUS, RECORDING MEDIUM AND METHOD OF PROCESSING SUBSTRATE

CROSS-REFERENCE TO RELATED APPLICATION

This application is based upon and claims the benefit of priority from Japanese Patent Application No. 2019-145220, filed on Aug. 7, 2019, the entire contents of which are incorporated herein by reference.

TECHNICAL FIELD

The present disclosure relates to a method of manufacturing a semiconductor device, a substrate processing apparatus, and a recording medium.

BACKGROUND

In a related art, as an example of processes of manufacturing a semiconductor device, a process of processing a substrate in a process container of a substrate processing apparatus is often carried out.

SUMMARY

The present disclosure provides some embodiments of a technique capable of improving a productivity by shortening a downtime of a substrate processing apparatus.

According to one or more embodiments of the present disclosure, there is provided a technique that includes (a) forming a film on a substrate by supplying a first processing gas to the substrate in a process container; (b) forming a first pre-coated film, which has a first thickness and has a material different from a material of the film formed in (a), in the process container by supplying a second processing gas into the process container in a state in which the substrate does not exist in the process container; and (c) forming a second pre-coated film, which has a second thickness smaller than the first thickness and has the same material as the material of the film formed in (a), on the first pre-coated film formed in the process container by supplying a third processing gas into the process container in the state in which the substrate does not exist in the process container.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

One or More Embodiments of the Present Disclosure

One or more embodiments of the present disclosure will now be described mainly with reference to FIGS. 1 to 5.

(1) Configuration of the Substrate Processing Apparatus

Figure 1:
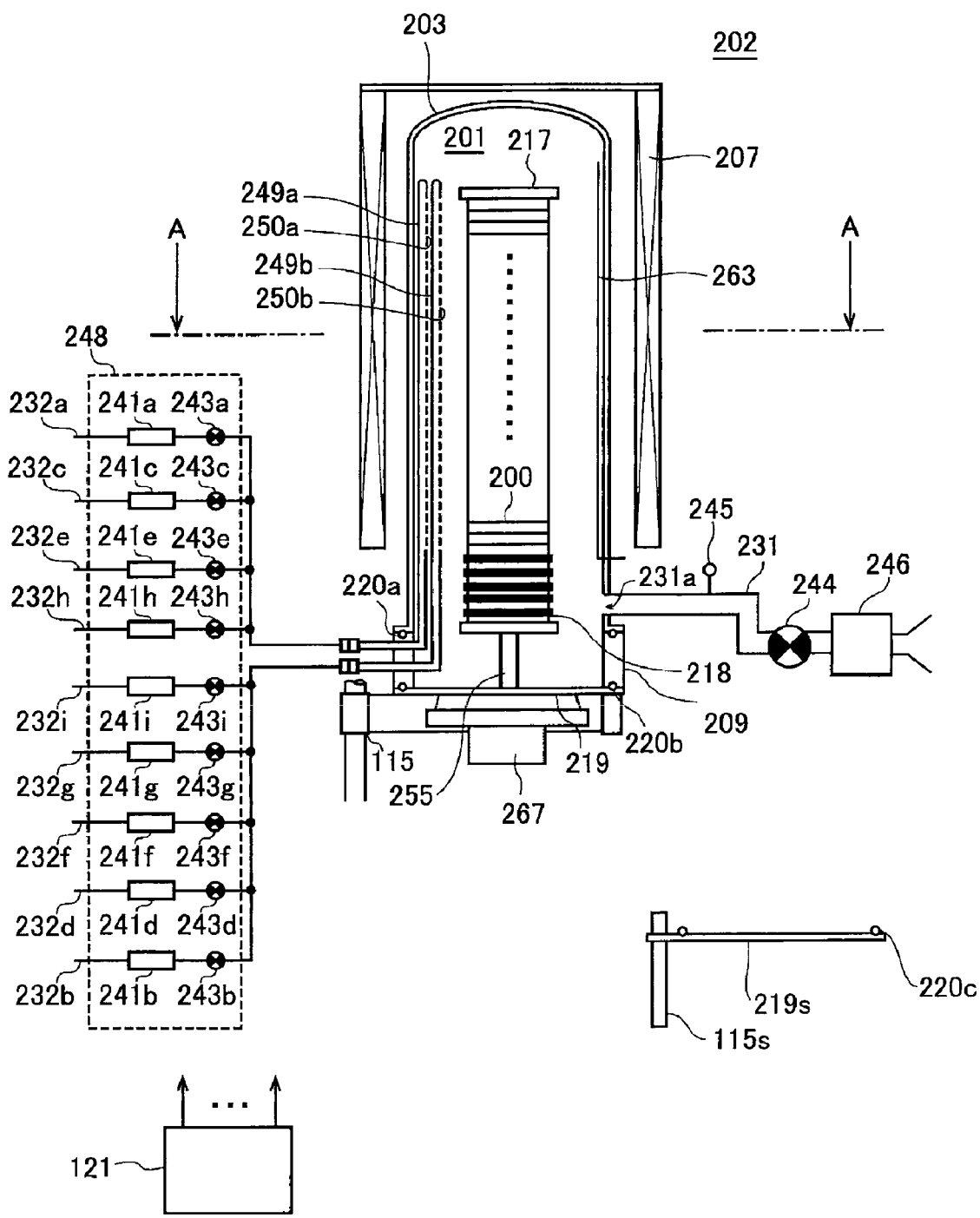
FIG. 1 is a schematic configuration view of a vertical type process furnace of a substrate processing apparatus suitably used in one or more embodiments of the present disclosure, in which a portion of the process furnace is shown in a vertical cross sectional view.

As illustrated in FIG. 1, a process furnace 202 includes a heater 207 as a heating mechanism (temperature regulator).

The heater 207 has a cylindrical shape and is supported by a holding plate so as to be vertically installed. The heater 207 functions as an activation mechanism (an excitation part) configured to thermally activate (excite) a gas.

A reaction tube 203 is disposed inside the heater 207 to be concentric with the heater 207. The reaction tube 203 is made of a heat resistant material, e.g., quartz ($SiO_2$), silicon carbide (SiC), or the like, and has a cylindrical shape with its upper end closed and its lower end opened. A manifold 209 is disposed below the reaction tube 203 in a concentric relationship with the reaction tube 203. The manifold 209 is made of a metal material, e.g., stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. Similar to the heater 207, the reaction tube 203 is vertically installed. A processing container (reaction container) mainly includes the reaction tube 203 and the manifold 209. A process chamber 201 is formed in a hollow cylindrical portion of the processing container. The process chamber 201 is configured to accommodate wafers 200 as substrates. The process to the wafers 200 is performed in the process chamber 201.

Nozzles 249a and 249b as first and second suppliers are installed in the process chamber 201 so as to penetrate a sidewall of the manifold 209. The nozzles 249a and 249b will be referred to as a first nozzle and a second nozzle, respectively. The nozzles 249a and 249b are each made of a heat resistant material which is a non-metallic material such as quartz, SiC or the like. The nozzles 249a and 249b are configured as common nozzles used for supplying plural kinds of gases, respectively.

Gas supply pipes 232a and 232b as first and second pipes are connected to the nozzles 249a and 249b, respectively. The gas supply pipes 232a and 232b are configured as common pipes used for supplying plural kinds of gases, respectively. MFCs (Mass flow controllers) 241a and 241b, which are flow rate controllers (flow rate control parts), and valves 243a and 243b, which are opening/closing valves, are installed in the gas supply pipes 232a and 232b sequentially from the corresponding upstream sides of gas flow, respectively. Gas supply pipes 232c, 232e, and 232h are respectively connected to the gas supply pipe 232a at the downstream side of the valve 243a. MFCs 241c, 241e, and 241h and valves 243c, 243e, and 243h are installed in the gas supply pipes 232c, 232e, and 232h sequentially from the corresponding upstream sides of gas flow, respectively. Gas supply pipes 232d, 232f, 232g, and 232i are respectively connected to the gas supply pipe 232b at the downstream side of the valve 243b. MFCs 241d, 241f, 241g, and 241i and valves 243d, 243f, 243g, and 243i are installed in the gas supply pipes 232d, 232f, 232g, and 232i sequentially from the corresponding upstream sides of gas flow, respectively.

The gas supply pipes 232a to 232i are each made of a metal material containing iron (Fe) and nickel (Ni). The material of the gas supply pipes 232a to 232i may contain Fe, Ni, and chromium (Cr), or may contain Fe, Ni, Cr, and molybdenum (Mo). That is, as the material of the gas supply pipes 232a to 232i, it may be possible to suitably use, in addition to SUS, for example, Hastelloy (registered trademark) with enhanced heat resistance and corrosion resistance by adding Fe, Mo, Cr, or the like to Ni, Inconel (registered trademark) with enhanced heat resistance and corrosion resistance by adding Fe, Cr, niobium (Nb), Mo, or the like to Ni, or the like. Furthermore, the material of the manifold 209 described above and materials of a seal cap 219, a rotary shaft 255, and an exhaust pipe 231 as described hereinbelow may be similar to those of the gas supply pipes 232a to 232i.

Figure 2:
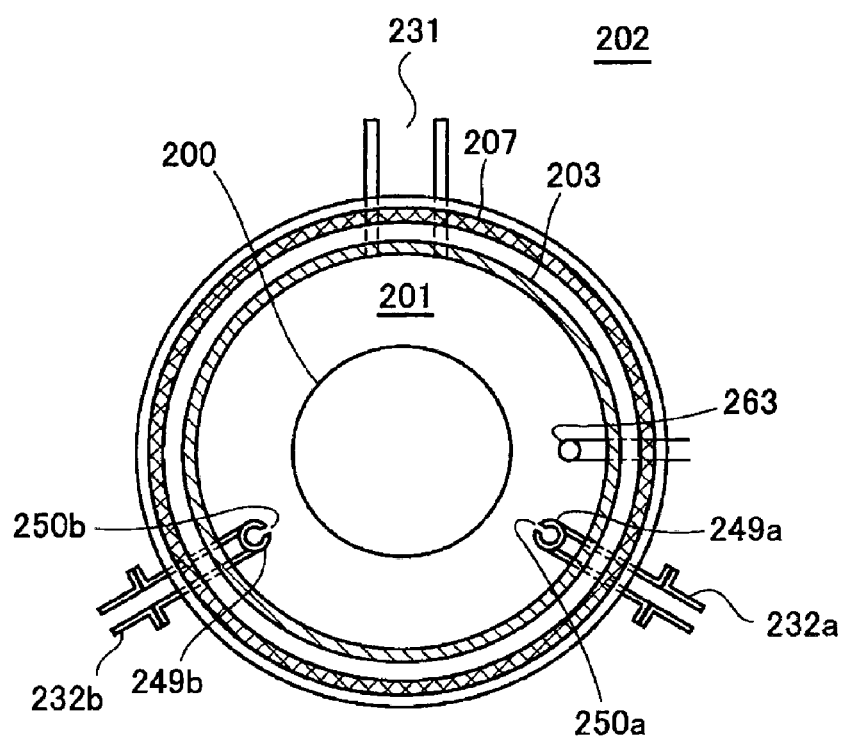
FIG. 2 is a schematic configuration view of a vertical type process furnace of the substrate processing apparatus suitably used in one or more embodiments of the present disclosure, in which a portion of the process furnace is shown in a cross sectional view taken along line A-A in FIG. 1.

As illustrated in FIG. 2, the nozzles 249a and 249b are disposed in a space with an annular plan-view shape between the inner wall of the reaction tube 203 and the wafers 200 such that the nozzles 249a and 249b extend upward along an arrangement direction of the wafers 200 from a lower portion of the inner wall of the reaction tube 203 to an upper portion of the inner wall of the reaction tube 203. Specifically, the nozzles 249a and 249b are installed at a lateral side of a wafer arrangement region in which the wafers 200 are arranged, namely in a region which horizontally surrounds the wafer arrangement region, so as to extend along the wafer arrangement region. Gas supply holes 250a and 250b for supplying a gas are installed at the side surfaces of the nozzles 249a and 249b, respectively. The gas supply holes 250a and 250b are opened toward the centers of the wafers 200 in plane view, so as to allow a gas to be supplied toward the wafers 200. The gas supply holes 250a and 250b may be formed in a plural number between the lower portion of the reaction tube 203 and the upper portion of the reaction tube 203.

A precursor gas, for example, a halosilane-based gas which contains silicon (Si) as a main element (predetermined element) constituting a film and a halogen element, is supplied from the gas supply pipe 232a into the process chamber 201 via the MFC 241a, the valve 243a, and the nozzle 249a. The precursor gas refers to a gaseous precursor, for example, a gas obtained by vaporizing a precursor which remains in a liquid state under a room temperature and an atmospheric pressure, or a precursor which remains in a gas state under a room temperature and an atmospheric pressure. The halosilane refers to a silane containing a halogen element. The halogen element contains chlorine (Cl), fluorine (F), bromine (Br), iodine (I), or the like. As the halosilane-based gas, it may be possible to use, for example, a precursor gas containing Si and Cl, i.e., a chlorosilane-based gas. The chlorosilane-based gas acts as a Si source. As the chlorosilane-based gas, it may be possible to use, for example, a hexachlorodisilane ($Si_2Cl_6$, abbreviation: HCDS) gas. The HCDS gas is a gas containing an element (Si) which becomes a solid alone under the aforementioned processing conditions, i.e., a gas which can deposit a film alone under the aforementioned processing conditions.

An oxygen (O)-containing gas as a reaction gas is supplied from the gas supply pipe 232b into the process chamber 201 via the MFC 241b, the valve 243b, and the nozzle 249b. The O-containing gas acts as an O source. As the O-containing gas, it may be possible to use, for example, an oxygen ($O_2$) gas.

A carbon (C)-containing gas as the reaction gas is supplied from the gas supply pipe 232c into the process chamber 201 via the MFC 241c, the valve 243c, the gas supply pipe 232a, and the nozzle 249a. The C-containing gas acts as a C source. As the C-containing gas, it may be possible to use, for example, a propylene ($C_3H_6$) gas which is a hydrocarbon-based gas.

A nitrogen (N)- and hydrogen (H)-containing gas as the reaction gas is supplied from the gas supply pipe 232d into the process chamber 201 via the MFC 241d, the valve 243d, the gas supply pipe 232b, and the nozzle 249b. The N- and H-containing gas acts as a N source. As the N- and H-containing gas, it may be possible to use, for example, an ammonia ($NH_3$) gas which is a hydrogen nitride-based gas.

A cleaning gas is supplied from the gas supply pipes 232e and 232f into the process chamber 201 via the MFCs 241e and 241f, the valves 243e and 243f, the gas supply pipes 232a and 232b, and the nozzles 249a and 249b. The cleaning gas acts as a cleaning gas in each of chamber cleaning, first nozzle cleaning, and second nozzle cleaning, which will be described later. As the cleaning gas, it may be possible to use, for example, a fluorine ($F_2$) gas.

A nitric oxide-based gas as an additive gas is supplied from the gas supply pipe 232g into the process chamber 201 via the MFC 241g, the valve 243g, the gas supply pipe 232b, and the nozzle 249b. The nitric oxide-based gas alone does not exert a cleaning action, but acts to improve the cleaning action of the cleaning gas by reacting with the cleaning gas in the chamber cleaning as described hereinbelow to generate active species such as, e.g., fluorine radicals, nitrosyl halide compounds, or the like. As the nitric oxide-based gas, it may be possible to use, for example, a nitrogen monoxide (NO) gas.

An inert gas, for example, a nitrogen ($N_2$) gas, is supplied from the gas supply pipes 232h and 232i into the process chamber 201 via the MFC 241h and 241i, the valves 243h and 243i, the gas supply pipes 232a and 232b, and the nozzles 249a and 249b. The $N_2$ gas acts as a purge gas, a carrier gas, a dilution gas, or the like.

A precursor gas supply system mainly includes the gas supply pipe 232a, the MFC 241a, the valve 243a, and the nozzle 249a. An O-containing gas supply system mainly includes the gas supply pipe 232b, the MFC 241b, the valve 243b, and the nozzle 249b. A C-containing gas supply system mainly includes the gas supply pipe 232c, the MFC 241c, the valve 243c, the gas supply pipe 232a, and the nozzle 249a. A N- and H-containing gas supply system mainly includes the gas supply pipe 232d, the MFC 241d, the valve 243d, the gas supply pipe 232b, and the nozzle 249b. A cleaning gas supply system mainly includes the gas supply pipes 232e and 232f, the MFCs 241e and 241f, and the valve 243e and 243f The gas supply pipes 232a and 232b and the nozzles 249a and 249b may be regarded as being included in the cleaning gas supply system. An additive gas supply system mainly includes the gas supply pipe 232g, the MFC 241g, the valve 243g, the gas supply pipe 232b, and the nozzle 249b. An inert gas supply system mainly includes the gas supply pipes 232h and 232i, the MFCs 241h and 241i, the valve 243h and 243i, the gas supply pipes 232a and 232b, and the nozzles 249a and 249b.

One or more of various supply systems described above may be configured as an integrated supply system 248 in which the valves 243a to 243i, the MFCs 241a to 241i, and the like are integrated. The integrated supply system 248 is connected to each of the gas supply pipes 232a to 232i so that a supply operation of various kinds of gases into the gas supply pipes 232a to 232i, i.e., an opening/closing operation of the valves 243a to 243i, a flow-rate-adjusting operation by the MFCs 241a to 241i or the like, is controlled by a controller 121 which will be described later. The integrated supply system 248 is configured as an integral type or division type integrated unit, and is also configured so that it is detachable from the gas supply pipes 232a to 232i or the like, so as to perform maintenance, replacement, expansion, or the like of the integrated supply system 248, on an integrated unit basis.

An exhaust port 231a configured to exhaust an internal atmosphere of the process chamber 201 is installed at a lower side of the sidewall of the reaction tube 203. The exhaust port 231a may be installed between the lower portion of the sidewall of the reaction tube 203 and the upper portion thereof, i.e., along the wafer arrangement region. An exhaust pipe 231 is connected to the exhaust port 231a. The exhaust pipe 231 is made of a metal material such as, e.g., stainless steel (SUS) or the like. A vacuum pump 246 as a vacuum exhaust device is connected to the exhaust pipe 231 via a pressure sensor 245 as a pressure detector (pressure detection part) which detects the internal pressure of the process chamber 201 and an APC (auto pressure controller) valve 244 as a pressure regulator (pressure regulation part). The APC valve 244 is configured so that a vacuum exhaust and a vacuum exhaust stop of the interior of the process chamber 201 can be performed by opening and closing the APC valve 244 while operating the vacuum pump 246 and so that the internal pressure of the process chamber 201 can be adjusted by adjusting an opening degree of the APC valve 244 based on pressure information detected by the pressure sensor 245 while operating the vacuum pump 246. An exhaust system mainly includes the exhaust pipe 231, the APC valve 244, and the pressure sensor 245. The vacuum pump 246 may be regarded as being included in the exhaust system.

A seal cap 219, which serves as a furnace opening cover configured to hermetically seal a lower end opening of the manifold 209, is installed under the manifold 209. The seal cap 219 is made of a metal material such as, e.g., stainless steel (SUS) or the like, and is formed in a disc shape. An O-ring 220b, which is a seal member making contact with the lower end portion of the manifold 209, is installed at an upper surface of the seal cap 219.

A rotator 267 configured to rotate a boat 217, which will be described later, is installed under the seal cap 219. A rotary shaft 255 of the rotator 267, which is made of a metal material such as stainless steel or the like and penetrates the seal cap 219, is connected to the boat 217. The rotator 267 is configured to rotate the wafers 200 by rotating the boat 217. The seal cap 219 is configured to be vertically moved up and down by a boat elevator 115 which is an elevator mechanism installed outside the reaction tube 203. The boat elevator 115 is configured as a transfer device (transfer mechanism) which loads and unloads (transfers) the wafers 200 into and from (out of) the process chamber 201 by moving the seal cap 219 up and down.

A shutter 219s as a furnace opening cover capable of hermetically seal the lower end opening of the manifold 209, with the boat 217 unloaded from the interior of the process chamber 201 by moving the seal cap 219 down, is installed under the manifold 209. The shutter 219s is made of a metal material such as, e.g., stainless steel or the like, and is formed in a disc shape. An O-ring 220c as a seal member making contact with the lower end portion of the manifold 209 is installed at an upper surface of the shutter 219s. An opening/closing operation (an up-down movement operation or a rotational movement operation) of the shutter 219s is controlled by a shutter-opening/closing mechanism 115s.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is composed of a heat resistant material such as quartz or SiC. Heat-insulating plates 218 composed of a heat resistant material such as quartz or SiC are installed below the boat 217 in multiple stages.

A temperature sensor 263 serving as a temperature detector is installed in the reaction tube 203. Based on temperature information detected by the temperature sensor 263, a degree of supplying electric power to the heater 207 is adjusted such that the interior of the process chamber 201 has a desired temperature distribution. The temperature sensor 263 is installed along the inner wall of the reaction tube 203.

Figure 3:
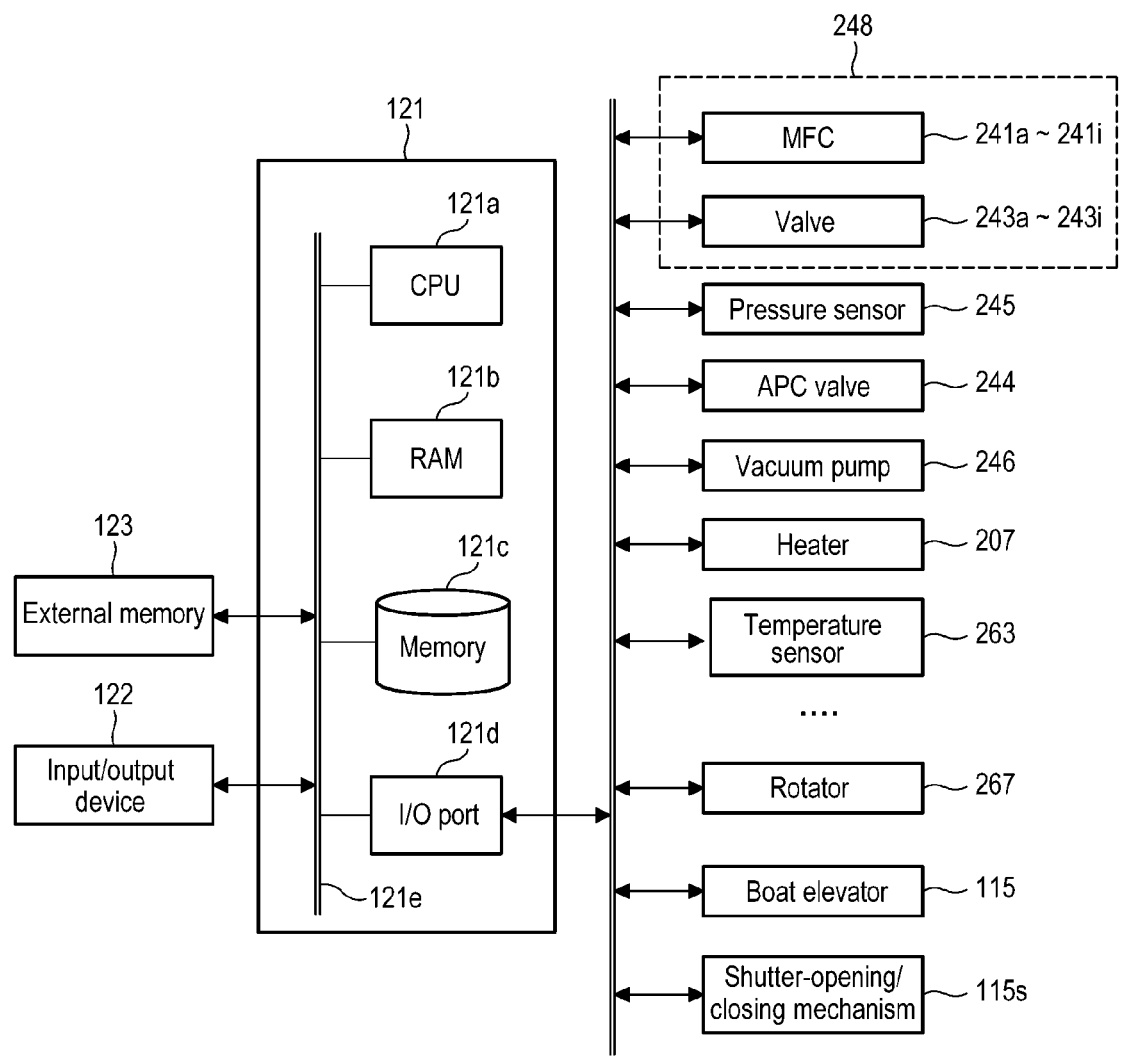
FIG. 3 is a schematic configuration view of a controller of the substrate processing apparatus suitably used in one or more embodiments of the present disclosure, in which a control system of the controller is shown in a block diagram.

As illustrated in FIG. 3, the controller 121, which is a control part (control means), may be configured as a computer including a CPU (central processing unit) 121a, a RAM (random access memory) 121b, a memory 121c, and an I/O port 121d. The RAM 121b, the memory 121c, and the I/O port 121d are configured to exchange data with the CPU 121a via an internal bus 121e. An input/output device 122 formed of, e.g., a touch panel or the like, is connected to the controller 121.

The memory 121c is configured by, for example, a flash memory, a HDD (hard disk drive), or the like. A control program for controlling operations of a substrate processing apparatus, a process recipe for specifying sequences and conditions of a film-forming process as described hereinbelow, a cleaning recipe for specifying sequences and conditions of a cleaning process as described hereinbelow, or a pre-coating recipe for specifying sequences and conditions of a pre-coating process as described hereinbelow is readably stored in the memory 121c. The process recipe functions as a program for causing the controller 121 to execute each sequence in the film-forming process, as described hereinbelow, to obtain a predetermined result. The cleaning recipe functions as a program for causing the controller 121 to execute each sequence in the cleaning process, as described hereinbelow, to obtain a predetermined result. The pre-coating recipe functions as a program for causing the controller 121 to execute each sequence in the pre-coating process, as described hereinbelow, to obtain a predetermined result. Hereinafter, the process recipe, the cleaning recipe, the pre-coating recipe, and the control program will be generally and simply referred to as a "program." Furthermore, the process recipe, the cleaning recipe, and the pre-coating recipe will be simply referred to as a "recipe." When the term "program" is used herein, it may indicate a case of including the recipe, a case of including the control program, or a case of including both the recipe and the control program. The RAM 121b is configured as a memory area (work area) in which a program, data, and the like read by the CPU 121a is temporarily stored.

The I/O port 121d is connected to the MFCs 241a to 241i, the valves 243a to 243i, the pressure sensor 245, the APC valve 244, the vacuum pump 246, the temperature sensor 263, the heater 207, the rotator 267, the boat elevator 115, the shutter-opening/closing mechanism 115s, and the like, as described above.

The CPU 121a is configured to read the control program from the memory 121c and execute the same. The CPU 121a is also configured to read the recipe from the memory 121c according to an input of an operation command from the input/output device 122. In addition, the CPU 121a is configured to control, according to the contents of the recipe thus read, the flow-rate-adjusting operation of various kinds of gases by the MFCs 241a to 241i, the opening/closing operation of the valves 243a to 243i, the opening/closing operation of the APC valve 244, the pressure-regulating operation performed by the APC valve 244 based on the pressure sensor 245, the driving and stopping of the vacuum pump 246, the temperature-adjusting operation performed by the heater 207 based on the temperature sensor 263, the operations of rotating the boat 217 and adjusting the rotation speed of the boat 217 with the rotator 267, the operation of moving the boat 217 up and down with the boat elevator 115, the operations of opening and closing the shutter 219s with the shutter-opening/closing mechanism 115s, and the like.

The controller 121 may be configured by installing, on the computer, the aforementioned program stored in an external memory 123. The external memory 123 may include, for example, a magnetic disc such as a HDD, an optical disc such as a CD, a magneto-optical disc such as a MO, a semiconductor memory such as a USB memory, and the like. The memory 121c or the external memory 123 is configured as a non-transitory computer-readable recording medium. Hereinafter, the memory 121c and the external memory 123 will be generally and simply referred to as a "recording medium." When the term "recording medium" is used herein, it may indicate a case of including the memory 121c, a case of including the external memory 123, or a case of including both the memory 121c and the external memory 123. Furthermore, the program may be supplied to the computer using a communication means such as the Internet or a dedicated line, instead of using the external memory 123.

(2) Substrate Processing

An example of a series of processing sequences including a film-forming sequence of forming a film on a wafer 200 as a substrate using the aforementioned substrate processing apparatus, which is one of the processes for manufacturing a semiconductor device, will be described mainly with reference to FIGS. 4 and 5. In the following descriptions, the operations of the respective parts constituting the substrate processing apparatus are controlled by the controller 121.

Figure 4:
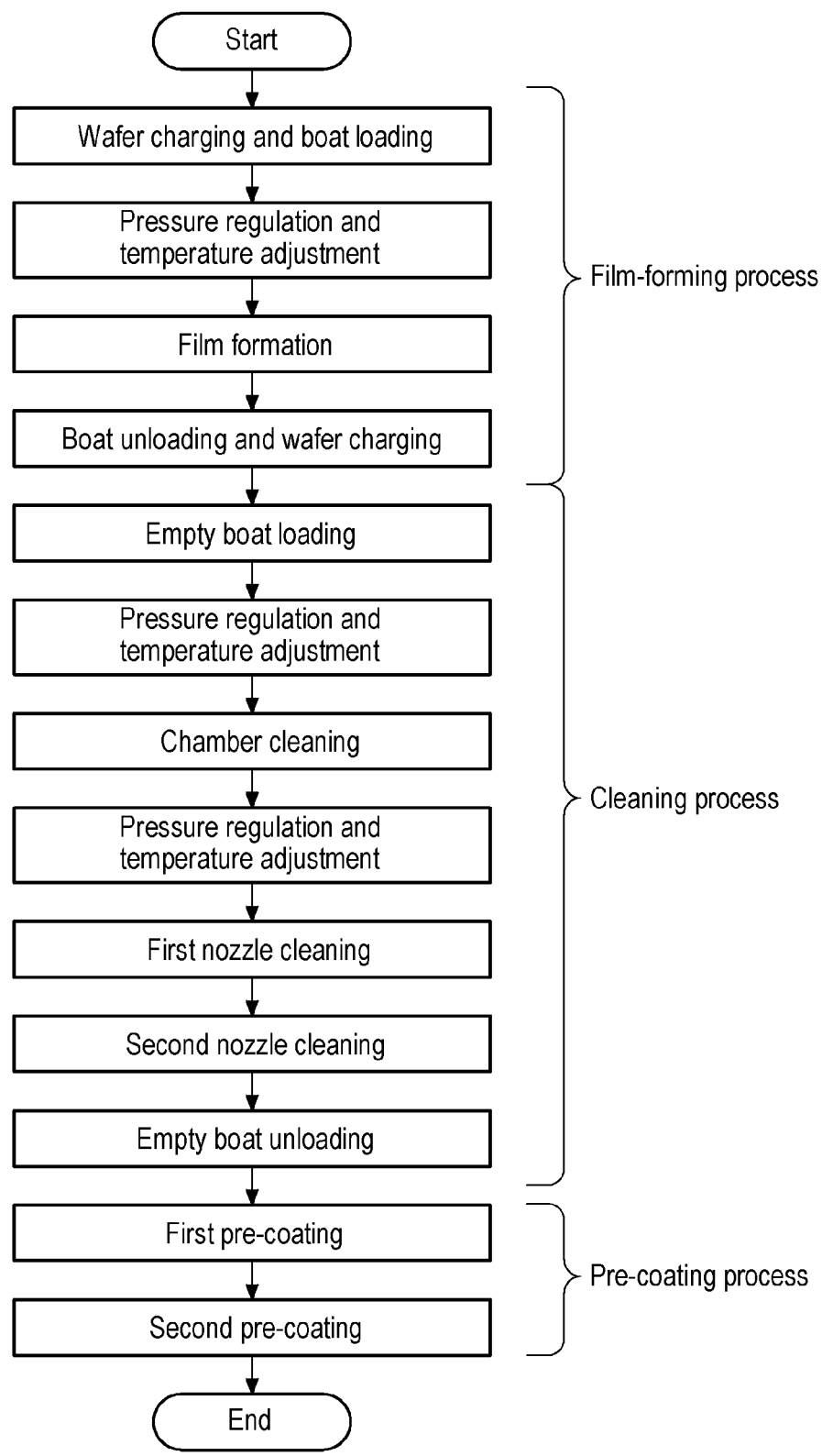
FIG. 4 is a view illustrating a substrate processing sequence according to one or more embodiments of the present disclosure.

In the series of processing sequences illustrated in FIG. 4, there are performed: a step of forming a SiOCN film which is an oxycarbonitride film as a film on a wafer 200 by supplying a first processing gas to the wafer 200 in the process container; a step of removing deposits deposited in the process container by supplying a cleaning gas into the process container in a state in which the wafer 200 does not exist in the process container; a step of forming a SiON film, which is an oxynitride film as a first pre-coated film having a first thickness and having a material different from that of the film formed on the wafer 200, in the process container by supplying a second processing gas into the process container in the state in which the wafer 200 does not exist in the process container; and a step of forming a SiOCN film, which is an oxycarbonitride film as a second pre-coated film having a second thickness smaller than the first thickness and having the same material as that of the film formed on the wafer 200, on the SiON film formed in the process container by supplying a third processing gas into the process container in the state in which the wafer 200 does not exist in the process container.

In the present embodiments, a HCDS gas which is a Si source, a $C_3H_6$ gas which is a C source, an $O_2$ gas which is an O source, and an $NH_3$ gas which is a N source are used as the first processing gas. Furthermore, a HCDS gas which is a Si source, an $O_2$ gas which is an O source, and an $NH_3$ gas which is a N source are used as the second processing gas. In addition, a HCDS gas which is a Si source, a $C_3H_6$ gas which is a C source, an $O_2$ gas which is an O source, and an $NH_3$ gas which is a N source are used as the third processing gas.

Figure 5:
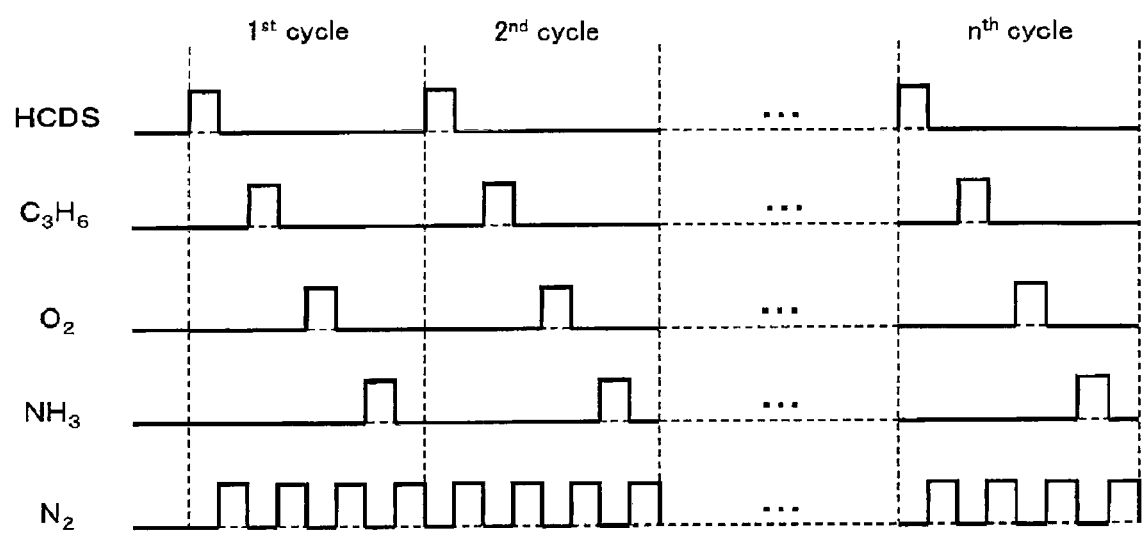
FIG. 5 is a view illustrating a gas supply sequence in film formation according to one or more embodiments of the present disclosure.

In the film-forming process of the present embodiments, as illustrated in the gas supply sequence in FIG. 5, a SiOCN film is formed on the wafer 200 by implementing a cycle a predetermined number of times (n times, where n is an integer of 1 or more), the cycle including sequentially and non-simultaneously performing: step 1 of supplying a HCDS gas to the wafer 200 in the process container; step 2 of supplying a C₃H₆ gas to the wafer 200 in the process container; step 3 of supplying an O₂ gas to the wafer 200 in the process container; and step 4 of supplying an NH₃ gas to the wafer 200 in the process container.

In the present disclosure, for the sake of convenience, the gas supply sequence illustrated in FIG. 5, i.e., the film-forming sequence, may sometimes be denoted as follows. The same denotation will be used in other embodiments as described hereinbelow.

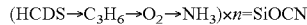

(HCDS→C₃H₆→O₂→NH₃)×n=SiOCN

When the term "wafer" is used herein, it may refer to a wafer itself or a laminated body of a wafer and a predetermined layer or film formed on the surface of the wafer. In addition, when the phrase "a surface of a wafer" is used herein, it may refer to a surface of a wafer itself or a surface of a predetermined layer or the like formed on a wafer. Furthermore, in the present disclosure, the expression "a predetermined layer is formed on a wafer" may mean that a predetermined layer is directly formed on a surface of a wafer itself or that a predetermined layer is formed on a layer or the like formed on a wafer. In addition, when the term "substrate" is used herein, it may be synonymous with the term "wafer."

Hereinafter, the series of processing sequences illustrated in FIG. 4 will be described in detail.

<Film-Forming Process>

First, a film-forming process of forming a film on the wafer 200 is performed. Hereinafter, a series of operations of the film-forming process will be described.

(Wafer Charging and Boat Loading)

If a plurality of wafers 200 is charged on the boat 217 (wafer charging), the shutter 219s may be moved by the shutter-opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 via the O-ring 220b.

(Pressure Regulation and Temperature Adjustment)

The interior of the process chamber 201, namely the space in which the wafers 200 are located, is vacuum-exhausted (depressurization-exhausted) by the vacuum pump 246 so as to reach a desired pressure (film-forming pressure). Furthermore, the wafers 200 in the process chamber 201 are heated by the heater 207 to a desired temperature (film-forming temperature). In addition, the rotation of the wafers 200 by the rotator 267 begins. The exhaust of the interior of the process chamber 201 and the heating and rotation of the wafers 200 may be continuously performed at least until the process to the wafers 200 is completed.

(Film Formation)

Next, the following steps 1 to 4 are sequentially performed.

[Step 1]

At this step, a HCDS gas is supplied to the wafer 200 in the process container (HCDS gas supply). Specifically, the valve 243a is opened to allow an HCDS gas to flow through the gas supply pipe 232a. The flow rate of the HCDS gas is adjusted by the MFC 241a. The HCDS gas is supplied into the process chamber 201 via the nozzle 249a and is exhausted from the exhaust port 231a. At this time, the HCDS gas is supplied to the wafer 200. Simultaneously, the valves 243h and 243i may be opened to supply a N₂ gas into the process chamber 201 via the nozzles 249a and 249b.

The processing conditions at this step may be exemplified as follows:

HCDS gas supply flow rate: 0.01 to 2 slm or 0.1 to 1 slm in some embodiments

N₂ gas supply flow rate (per gas supply pipe): 0 to 10 slm

Supply time of each gas: 1 to 120 seconds or 1 to 60 seconds in some embodiments Processing temperature: 250 to 800 degrees C. or 400 to 700 degrees C. in some embodiments Processing pressure: 1 to 2,666 Pa or 67 to 1,333 Pa in some embodiments.

Furthermore, in the present disclosure, the expression of the numerical range such as "250 to 800 degrees C." may mean that a lower limit value and an upper limit value are included in that range. Therefore, for example, "250 to 800 degrees C." may mean "250 degrees C. or higher and 800 degrees C. or lower." The same applies to other numerical ranges.

By supplying the HCDS gas to the wafer 200 under the aforementioned conditions, a Si-containing layer containing Cl is formed as a first layer on the outermost surface of the wafer 200. The Si-containing layer containing Cl is formed by physisorption of HCDS, chemisorption of HCDS or a substance (hereinafter, Si$_x$Cl$_y$) obtained by partially decomposing HCDS, deposition of Si by pyrolysis of HCDS, or the like, to the outermost surface of the wafer 200. The Si-containing layer containing Cl may be an adsorption layer (a physisorption layer or a chemisorption layer) of HCDS or Si$_x$Cl$_y$, or may be a deposit layer of Si containing Cl. In the present disclosure, the Si-containing layer containing Cl will be simply referred to as a Si-containing layer.

After the first layer is formed, the valve 243a is closed to stop the supply of the HCDS gas into the process chamber 201. Then, the interior of the process chamber 201 is vacuum-exhausted and the gas or the like remaining within the process chamber 201 is removed from the interior of the process chamber 201 (purge). At this time, the valves 243h and 243i are opened to supply a N₂ gas into the process chamber 201. The N₂ gas acts as a purge gas.

As the precursor gas, it may be possible to use, in addition to the HCDS gas, a chlorosilane-based gas such as a monochlorosilane (SiH₃Cl, abbreviation: MCS) gas, a dichlorosilane (SiH₂Cl₂, abbreviation: DCS) gas, a trichlorosilane (SiHCl₃, abbreviation: TCS) gas, a tetrachlorosilane (SiCl₄, abbreviation: STC) gas, an octachlorotrisilane (Si₃Cl₈, abbreviation: OCTS) gas, or the like.

[Step 2]

After step 1 is completed, a C₃H₆ gas is supplied to the wafer 200 in the process container, namely the first layer formed on the wafer 200 (C₃H₆ gas supply). Specifically, the valve 243c is opened to allow a C₃H₆ gas to flow through the gas supply pipe 232c. The flow rate of the C₃H₆ gas is adjusted by the MFC 241c. The C₃H₆ gas is supplied into the process chamber 201 via the gas supply pipe 232a and the nozzle 249a and is exhausted from the exhaust port 231a. At this time, the C₃H₆ gas is supplied to the wafer 200. Simultaneously, the valves 243h and 243i may be opened to supply a N₂ gas into the process chamber 201 via the nozzles 249a and 249b.

The processing conditions at this step may be exemplified as follows:

C₃H₆ gas supply flow rate: 0.1 to 10 slm

Supply time of C₃H₆ gas: 1 to 120 seconds or 1 to 60 seconds in some embodiments Processing pressure: 1 to 6,000 Pa or 1 to 5,000 Pa in some embodiments.

Other processing conditions may be similar to the processing conditions of step 1.

By supplying the $C_3H_6$ gas to the wafer 200 under the aforementioned conditions, a C-containing layer is formed on the first layer to form a second layer containing Si and C on the wafer 200.

After the second layer is formed, the valve 243c is closed to stop the supply of the $C_3H_6$ gas into the process chamber 201. Then, the gas or the like, which remains within the process chamber 201, is removed from the interior of the process chamber 201 according to the same processing procedures as those of the purge at step 1 (purge).

As the reaction gas (C-containing gas), it may be possible to use, in addition to the $C_3H_6$ gas, a hydrocarbon-based gas such as an acetylene ($C_2H_2$) gas, an ethylene ($C_2H_4$) gas, or the like.

[Step 3]

After step 2 is completed, an $O_2$ gas is supplied to the wafer 200 in the process container, namely the second layer formed on the wafer 200 ($O_2$ gas supply). Specifically, the valve 243b is opened to allow an $O_2$ gas to flow through the gas supply pipe 232b. The flow rate of the $O_2$ gas is adjusted by the MFC 241b. The $O_2$ gas is supplied into the process chamber 201 via the nozzle 249b and is exhausted from the exhaust port 231a. At this time, the $O_2$ gas is supplied to the wafer 200. Simultaneously, the valves 243h and 243i may be opened to supply a $N_2$ gas into the process chamber 201 via the nozzles 249a and 249b.

The processing conditions at this step may be exemplified as follows:

$O_2$ gas supply flow rate: 0.1 to 10 slm

Supply time of $O_2$ gas: 1 to 120 seconds or 1 to 60 seconds in some embodiments Processing pressure: 1 to 4,000 Pa or 1 to 3,000 Pa in some embodiments.

Other processing conditions may be similar to the processing conditions of step 1.

By supplying the $O_2$ gas to the wafer 200 under the aforementioned conditions, at least a portion of the second layer formed on the wafer 200 is oxidized (modified). By modifying the second layer, a third layer containing Si, O, and C, i.e., a silicon oxycarbide layer (SiOC layer), is formed on the wafer 200. When forming the third layer, an impurity such as Cl contained in the second layer constitutes a gaseous substance containing at least Cl in the process of the modification reaction of the second layer with the $O_2$ gas and is exhausted from the interior of the process chamber 201. Thus, the third layer becomes a layer having a smaller amount of impurity such as Cl than the first and second layers.

After the third layer is formed, the valve 243b is closed to stop the supply of the $O_2$ gas into the process chamber 201. Then, the gas or the like, which remains within the process chamber 201, is removed from the process chamber 201 according to the same processing procedures as those of the purge at step 1 (purge).

As the reaction gas (O-containing gas), it may be possible to use, in addition to the $O_2$ gas, for example, an ozone ($O_3$) gas, water vapor ($H_2O$ gas), a nitric oxide (NO) gas, a nitrous oxide ($N_2O$) gas, or the like.

[Step 4]

After step 3 is completed, an $NH_3$ gas is supplied to the wafer 200 in the process container, namely the third layer formed on the wafer 200 ($NH_3$ gas supply). Specifically, the valve 243d is opened to allow an $NH_3$ gas to flow through the gas supply pipe 232d. The flow rate of the $NH_3$ gas is adjusted by the WC 241d. The $NH_3$ gas is supplied into the process chamber 201 via the gas supply pipe 232b and the nozzle 249b and is exhausted from the exhaust port 231a. At this time, the $NH_3$ gas is supplied to the wafer 200. Simultaneously, the valves 243h and 243i may be opened to supply a $N_2$ gas into the process chamber 201 via the nozzles 249a and 249b.

The processing conditions at this step may be exemplified as follows:

$NH_3$ gas supply flow rate: 0.1 to 10 slm

Supply time of $NH_3$ gas: 1 to 120 seconds or 1 to 60 seconds in some embodiments Processing pressure: 1 to 4,000 Pa or 1 to 3,000 Pa in some embodiments.

Other processing conditions may be similar to the processing conditions of step 1.

By supplying the $NH_3$ gas to the wafer 200 under the aforementioned conditions, at least a portion of the third layer formed on the wafer 200 is nitrided (modified). By modifying the third layer, a fourth layer containing Si, O, C, and N, i.e., a silicon oxycarbonitride layer (SiOCN layer), is formed on the wafer 200. When forming the fourth layer, an impurity such as Cl contained in the third layer constitutes a gaseous substance containing at least Cl in the process of the modification reaction of the third layer with the $NH_3$ gas and is exhausted from the interior of the process chamber 201. Thus, the fourth layer becomes a layer having a smaller amount of impurity such as Cl than the third layer.

After the fourth layer is formed, the valve 243d is closed to stop the supply of the $NH_3$ gas into the process chamber 201. Then, the gas or the like, which remains within the process chamber 201, is removed from the interior of the process chamber 201 according to the same processing procedures as those of the purge at step 1 (purge).

As the reaction gas (N- and H-containing gas), it may be possible to use, in addition to the $NH_3$ gas, for example, a hydrogen nitride-based gas such as a diazene ($N_2H_2$) gas, a hydrazine ($N_2H_4$) gas, a $N_3H_8$ gas, or the like.

[Performing a Predetermined Number of Times]

A cycle which non-simultaneously, i.e., non-synchronously, performs steps 1 to 4 described above is implemented a predetermined number of times (n times, where n is an integer of 1 or more), whereby a silicon oxycarbonitride film (SiOCN film) which is a film containing Si, O, C and N and having a predetermined composition and a predetermined film thickness can be formed on the wafer 200. The aforementioned cycle may be repeated multiple times.

(After-Purge and Atmospheric Pressure Return)

After the film formation is completed, the $N_2$ gas as a purge gas is supplied from each of the nozzles 249a and 249b into the process chamber 201 and is exhausted from the exhaust port 231a. Thus, the interior of the process chamber 201 is purged and the gas or the reaction byproduct, which remains within the process chamber 201, is removed from the interior of the process chamber 201 (after-purge). Thereafter, the internal atmosphere of the process chamber 201 is substituted by an inert gas (inert gas substitution). The internal pressure of the process chamber 201 is returned to an atmospheric pressure (atmospheric pressure return).

(Boat Unloading and Wafer Discharging)

The seal cap 219 is moved down by the boat elevator 115 to open the lower end of the manifold 209. Then, the processed wafers 200 supported on the boat 217 are unloaded from the lower end of the manifold 209 to the outside of the reaction tube 203 (boat unloading). After the boat unloading, the shutter 219s is moved so that the lower end opening of the manifold 209 is sealed by the shutter 219s via the O-ring 220c (shutter closing). The processed wafers 200 are unloaded to the outside of the reaction tube 203 and are subsequently discharged from the boat 217 (wafer discharging).

<Cleaning Process>

When the aforementioned film-forming process is performed, deposits containing a thin film such as a SiOCN film are adhered to and accumulated in the process container, i.e., on the surface of any member in the process container such as the inner wall of the reaction tube 203, the outer surfaces of the nozzles 249a and 249b, the inner surfaces of the nozzles 249a and 249b, the inner surface of the manifold 209, the surface of the boat 217, the upper surface of the seal cap 219, or the like. If the amount of deposits, i.e., the cumulative film thickness, becomes too large, the deposits may be delaminated, rapidly increasing the amount of particles generated. Therefore, a cleaning process is performed to remove the deposits deposited in the process container before the cumulative film thickness (the amount of deposits) reaches a predetermined thickness (predetermined amount) prior to the occurrence of delamination or dropping of the deposits. Hereinafter, a series of operations of the cleaning process will be described.

(Empty Boat Loading)

The shutter 219s is moved by the shutter-opening/closing mechanism 115s to open the lower end opening of the manifold 209 (shutter opening). Thereafter, the empty boat 217, i.e., the boat 217 with no wafer 200 charged, is lifted up by the boat elevator 115 and is loaded into the process chamber 201. In this state, the seal cap 219 seals the lower end of the manifold 209 via the O-ring 220b.

(Pressure Regulation and Temperature Adjustment)

After the loading of the empty boat 217 into the process chamber 201 is completed, the interior of the process chamber 201 is vacuum-exhausted by the vacuum pump 246 so as to reach a desired pressure (chamber-cleaning pressure). Furthermore, the interior of the process chamber 201 is heated by the heater 207 to a desired temperature (chamber-cleaning temperature). At this time, the surfaces of the members in the process chamber 201 (in the process container), i.e., the inner wall of the reaction tube 203, the surfaces of the nozzles 249a and 249b, the surface of the boat 217, and the like, are also heated to the chamber-cleaning temperature. In addition, the rotation of the boat 217 by the rotator 267 begins. The driving of the vacuum pump 246, the heating of the interior of the process chamber 201, and the rotation of the boat 217 may be continuously performed at least until the nozzle cleaning as described hereinbelow is completed. The boat 217 may also not be rotated.

(Chamber Cleaning)

After the internal pressure and temperature of the process chamber 201 are stabilized, the interior of the process chamber 201 is cleaned by supplying a $F_2$ gas and a NO gas into the process chamber 201. Specifically, the valves 243e and 243g are opened to allow a $F_2$ gas to flow through the gas supply pipe 232e and to allow a NO gas to flow through the gas supply pipe 232g. The flow rates of the $F_2$ gas and the NO gas are adjusted by the MFCs 241e and 241g, respectively. The $F_2$ gas and the NO gas are supplied into the process chamber 201 via the gas supply pipes 232a and 232b and the nozzles 249a and 249b and are exhausted from the exhaust port 231a. Simultaneously, the valves 243h and 243i may be opened to supply a $N_2$ gas into the process chamber 201 via the nozzles 249a and 249b.

The processing conditions at this step may be exemplified as follows:

$F_2$ gas supply flow rate: 0.5 to 10 slm

NO gas supply flow rate: 0.5 to 10 slm $N_2$ gas supply flow rate (per gas supply pipe): 0 to 10 slm Supply time of each gas: 1 to 60 minutes or 10 to 20 minutes in some embodiments Processing temperature (chamber-cleaning temperature): 100 to 350 degrees C. or 200 to 300 degrees C. in some embodiments Processing pressure (chamber-cleaning pressure): 1,333 to 53,329 Pa or 9,000 to 16,665 Pa in some embodiments.

By supplying the $F_2$ gas and the NO gas into the process chamber 201 under the aforementioned processing conditions, the NO gas can be added to the $F_2$ gas, and these gases can be mixed and reacted in the process chamber 201. By this reaction, active species such as, e.g., fluorine radicals (F*) or nitrosyl fluoride (FNO) (hereinafter, these will be generally referred to as FNO or the like), can be generated in the process chamber 201. As a result, a mixture gas obtained by adding FNO or the like to the $F_2$ gas exists in the process chamber 201. The mixture gas obtained by adding FNO or the like to the $F_2$ gas is brought into contact with the surfaces of the members in the process chamber 201, for example, the inner wall of the reaction tube 203, the surfaces of the nozzles 249a and 249b, the surface of the boat 217, and the like. At this time, deposits on the surface of any member in the process chamber 201 can be removed by a thermochemical reaction (etching reaction). The FNO or the like acts to promote the etching reaction by the $F_2$ gas and to increase the etching rate of the deposits, i.e., acts to assist the etching.

After a predetermined time elapses and the cleaning of the interior of the process chamber 201 is completed, the valves 243e and 243g are closed to stop the supply of the $F_2$ gas and the NO gas into the process chamber 201. Then, the interior of the process chamber 201 is vacuum-exhausted and the gas or the like remaining within the process chamber 201 is removed from the interior of the process chamber 201 (purge). At this time, the valves 243h and 243i are opened to supply a $N_2$ gas into the process chamber 201. The $N_2$ gas acts as a purge gas.

As the cleaning gas, it may be possible to use, in addition to the $F_2$ gas, a hydrogen fluoride (HF) gas, a nitrogen fluoride ($NF_3$) gas, a chlorine fluoride ($ClF_3$) gas, or a mixture gas thereof. This also applies to the nozzle cleaning as described hereinbelow.

As the additive gas, it may be possible to use, in addition to the NO gas, a hydrogen ($H_2$) gas, an $O_2$ gas, a nitrous oxide ($N_2O$) gas, an isopropyl alcohol (($CH_3$)$_2$CHOH, abbreviation: IPA) gas, a methanol ($CH_3OH$) gas, water vapor ($H_2O$ gas), a HF gas, or a mixture gas thereof.

Furthermore, when the HF gas is used as the additive gas, one of the $F_2$ gas, the $ClF_3$ gas, the $NF_3$ gas, and a mixture gas thereof may be used as the cleaning gas. In addition, when the HF gas is used as the cleaning gas and one of the IPA gas, the methanol gas, the $H_2O$ gas, and a mixture gas thereof is used as the additive gas, it is desirable that the aforementioned processing temperature be set at a predetermined temperature which falls within a range of, for example, 30 to 300 degrees C. or 50 to 200 degrees C. in some embodiments.

As the inert gas, it may be possible to use, in addition to the $N_2$ gas, a rare gas such as an Ar gas, a He gas, a Ne gas, a Xe gas, or the like. This also applies to each step as described hereinbelow.

(Pressure Regulation and Temperature Adjustment)

After the chamber cleaning is completed, the interior of the process chamber 201 is vacuum-exhausted by the vacuum pump 246 so as to reach a desired pressure (nozzle-cleaning pressure). Furthermore, the interior of the nozzles 249a and 249b is heated by the heater 207 to a desired temperature (nozzle-cleaning temperature).

(First Nozzle Cleaning)

After the interior pressure of the process chamber 201 and the internal temperature of the nozzles 249a and 249b are stabilized, the interior of the nozzle 249a is cleaned by supplying a $F_2$ gas into the nozzle 249a. Specifically, the valve 243e is opened to allow a $F_2$ gas to flow through the gas supply pipe 232e. The flow rate of the $F_2$ gas is adjusted by the MFC 241e. The $F_2$ gas is supplied into the nozzle 249a via the gas supply pipe 232a to flow through the process chamber 201 and is exhausted from the exhaust port 231a. Simultaneously, the valves 243h and 243i may be opened to supply a $N_2$ gas into the process chamber 201 via the nozzles 249a and 249b.

The processing conditions at this step may be exemplified as follows:

$F_2$ gas supply flow rate: 0.5 to 10 slm $N_2$ gas supply flow rate (per gas supply pipe): 0 to 10 slm Supply time of each gas: 1 to 60 minutes or 10 to 20 minutes in some embodiments Processing temperature (nozzle-cleaning temperature): 400 to 500 degrees C. or 400 to 450 degrees C. in some embodiments Processing pressure (nozzle-cleaning pressure): 1,333 to 40,000 Pa or 6,666 to 16,665 Pa in some embodiments.

By supplying the $F_2$ gas into the nozzle 249a under the aforementioned processing conditions, deposits in the nozzle 249a can be removed by a thermochemical reaction. After a predetermined time elapses and the cleaning of the interior of the nozzle 249a is completed, the valve 243e is closed to stop the supply of the $F_2$ gas into the nozzle 249a. Then, the interior of the process chamber 201 is purged in the same processing procedure as that of the purge in the chamber cleaning described above (purge).

(Second Nozzle Cleaning)

After the cleaning of the interior of the nozzle 249a is completed, the interior of the nozzle 249b is cleaned by supplying an $F_2$ gas into the gas supply pipe 232b. Specifically, the valve 243f is opened to allow an $F_2$ gas to flow through the gas supply pipe 232f. The flow rate of the $F_2$ gas is adjusted by the MFC 241f. The $F_2$ gas is supplied into the nozzle 249b via the gas supply pipe 232b to flow through the process chamber 201 and is exhausted from the exhaust port 231a. Simultaneously, the valves 243h and 243i may be opened to supply a $N_2$ gas into the process chamber 201 via the nozzles 249a and 249b.

The processing conditions at this step may be similar to the processing conditions in the first nozzle cleaning described above.

By supplying the $F_2$ gas into the nozzle 249b under the aforementioned processing conditions, deposits in the nozzle 249b can be removed by a thermochemical reaction. After a predetermined time elapses and the cleaning of the interior of the nozzle 249b is completed, the valve 243f is closed to stop the supply of the $F_2$ gas into the nozzle 249b. Then, the interior of the process chamber 201 is purged in the same processing procedure as that of the purge in the chamber cleaning described above (purge). Thereafter, the internal atmosphere of the process chamber 201 is substituted by an inert gas (inert gas substitution). By the series of operations described above, the cleaning process is completed.

<Pre-Coating Process>

After the cleaning process is completed and before the boat unloading is performed, i.e., in a state in which the empty boat is loaded into the process container, a pre-coating process is performed in the process container, i.e., on the surfaces of the members in the process container such as the inner wall of the reaction tube 203, the outer surfaces of the nozzles 249a and 249b, the inner surfaces of the nozzles 249a and 249b, the inner surface of the manifold 209, the surface of the boat 217, the upper surface of the seal cap 219, and the like.

After the cleaning process, if the film-forming process is performed in the process container without performing the pre-coating process, there may be a case where a film thickness drop phenomenon in which the thickness of the film formed on the wafer 200 becomes smaller than a target film thickness occurs. This may be considered to be because the state of the interior of the process container after the cleaning process is different from the state of the interior of the process container when the film-forming process is repeatedly performed, and thus, the processing gas is consumed on the surface of any member in the process container during the film-forming process, making the amount of the processing gas supplied to the surface of the wafer 200 insufficient. By performing the pre-coating process after the cleaning process and before the film-forming process, it is possible to suppress the occurrence of the film thickness drop phenomenon and to stabilize the film thickness of the film formed on the wafer 200. A series of operations of the pre-coating process will be described below.

(First Pre-coating)

In a state in which the wafer 200 does not exist in the process container, a cycle which sequentially and non-simultaneously performs the same steps as step 1, step 3, and step 4 in the aforementioned film formation in the process container is implemented a predetermined number of times (x times, where x is an integer of 1 or more). The processing procedures and processing conditions at each step may be similar to the processing procedures and processing conditions in the aforementioned film formation, except that each gas is supplied into the process container, instead of being supplied to the wafer 200. Thus, a film containing Si, O, and N, i.e., a silicon oxynitride film (SiON film), is formed as a first pre-coated film in the process container, i.e., on the surface of any member in the process container. In first pre-coating, a SiON film having a first thickness is formed in the process container. It is desirable that the thickness (first thickness) of the first pre-coated film (SiON film) be set at a thickness which falls within a range of, for example, 150 Å or more and 350 Å or less or 200 Å or more and 300 Å or less in some embodiments.

The first pre-coated film (SiON film) is a C-free film, and has a different material, i.e., a different molecular structure, from that of the film (SiOCN film) formed on the wafer 200. Furthermore, the first pre-coated film (SiON film) contains no element other than the elements (Si, O, C, and N) contained in the film (SiOCN film) formed on the wafer 200.

(Second Pre-Coating)

After the SiON film having the first thickness is formed in the process container, i.e., on the surface of any member in the process container, by the first pre-coating, a cycle which sequentially and non-simultaneously performs the same steps as steps 1 to 4 in the aforementioned film formation in the process container is implemented a predetermined number of times (y times, where y is an integer of 1 or more) in a state in which the wafer 200 does not exist in the process container. The processing procedures and processing conditions at each step may be similar to the processing procedures and processing conditions in the aforementioned film formation, except that each gas is supplied into the process container, instead of being supplied to the wafer 200. Thus, a SiOCN film which is a film containing Si, O, C, and N is formed as a second pre-coated film in the process container, i.e., on the first pre-coated film (SiON film) formed on the surface of any member in the process container. In second pre-coating, a SiOCN film having a second thickness smaller than the thickness (first thickness) of the SiON film is formed on the SiON film formed in the process container.

The second pre-coated film (SiOCN film) is a C-containing film, and has the same material as that of the film (SiOCN film) formed on the wafer 200. That is, the second pre-coated film (SiOCN film) contains no element other than the elements (Si, O, C, and N) contained in the film (SiOCN film) formed on the wafer 200.

In other words, both the first pre-coated film (SiON film) and the second pre-coated film (SiOCN film) contain no element other than the elements contained in the film (SiOCN film) formed on the wafer 200. Therefore, since the processing gas in the film-forming process can be used in each pre-coating, the addition of a gas supply system for performing the pre-coating is not required. Thus, it is possible to reduce the cost of the substrate processing apparatus. Hereinafter, a film formed by laminating the second pre-coated film on the first pre-coated film will be referred to as a pre-coated film.

The material of the second pre-coated film, which is the outermost surface of the pre-coated film, needs to be equal to the material of the film formed on the wafer 200. This is because, when the wafer 200 is loaded into the process container and the SiOCN film is formed on the wafer 200 after the pre-coating, if the outermost surface of the pre-coated film formed in the process container is the SiON film, the pre-coated film may absorb C introduced into the SiOCN film formed on the wafer 200 when the SiOCN film is formed on the wafer 200, which may vary in the composition of the film formed on the wafer 200. In order to stabilize the composition of the film formed on the wafer 200, the second pre-coated film, which is the outermost surface of the pre-coated film, needs to be formed of a film having the same material as that of the film formed on the wafer 200. Furthermore, in this case, it is more desirable that the second pre-coated film be formed of a film having the same composition (especially C concentration) as that of the film formed on the wafer 200. This makes it possible to more stabilize the composition (especially C concentration) of the film formed on the wafer 200.

In addition, it is desirable that the thickness (second thickness) of the second pre-coated film (SiOCN film) be set such that the second pre-coated film is pinhole-free. Specifically, it is desirable that the second thickness be set at a thickness of more than 25 Å, for example, at a thickness which falls within a range of more than 25 Å and 150 Å or less, 30 Å or more and 100 Å or less in some embodiments, or 30 Å or more and 50 Å or less in some embodiments.

Furthermore, the supply order of a Si source, an O source, and a N source in the first pre-coating and the supply order of a Si source, a C source, an O source, and a N source in the second pre-coating be set equal to the supply order of a Si source, a C source, an O source, and a N source in the film formation. This makes it possible to make the composition of the pre-coated film formed on the surface in the process container close to the composition of the film formed on the wafer 200, and to more stabilize the C concentration of the SiOCN film formed on the wafer 200, i.e., the film composition.

After the first pre-coating and the second pre-coating are completed, the interior of the process chamber 201 is purged in the same processing procedure as that of the purge in the chamber cleaning described above. Thereafter, the internal atmosphere of the process chamber 201 is substituted by an inert gas.

The pre-coating process is completed by the series of operations described above. By the pre-coating process described above, it is possible to suppress the film thickness drop phenomenon from occurring during the film formation. In addition, by the pre-coating process described above, it is possible to adjust the environments and conditions in the process container before the next film-forming process.

(Empty Boat Unloading)

At the pre-coating process is completed, the seal cap 219 is moved down by the boat elevator 115 to open the lower end of the manifold 209. Then, the empty boat 217 is unloaded from the lower end of the manifold 209 to the outside of the reaction tube 203 (boat unloading). After the boat unloading, the shutter 219s is moved so that the lower end opening of the manifold 209 is sealed by the shutter 219s via the O-ring 220c (shutter closing).

(3) Effects According to the Present Embodiments

According to the present embodiments, one or more effects as set forth below may be achieved.

(a) By forming the SiON film as the first pre-coated film and forming the SiOCN film as the second pre-coated film thereon in the process container of the substrate processing apparatus (hereinafter, also referred to as the apparatus) which forms the SiOCN film on the wafer to form the pre-coated film in two steps in this way, it is possible to shorten the pre-coating time and to shorten the downtime of the apparatus. That is, it is possible to increase the operating rate of the apparatus and to improve the productivity.

The reason is that the SiOCN film described above is a multi-component film, and therefore, the film-forming time tends to be prolonged. For example, in the case of forming a binary film such as a SiN film or the like, the process per cycle is a two-process of a process of supplying a Si source and a process of supplying a N source, whereas in the formation of a quaternary film such as a SiOCN film or the like, the process per cycle is a four-process of a process of supplying a Si source, a process of supplying a C source, a process of supplying an O source, and a process of supplying a N source. Therefore, the quaternary film has a longer film-forming time than the binary film by two processes per cycle. In particular, the supply time of the C source (the supply time of the $C_3H_6$ gas in the present embodiments) when forming the SiOCN film tends to be longer than the supply time of other processing gases. The supply time of the C source does not greatly affect the substantial throughput when the film thickness of the SiOCN film formed on the wafer is relatively small, such as, e.g., 50 to 80 Å. However, even in this case, it may set the film thickness of the pre-coated film at a thickness which falls within a range of, for example, 200 Å or more and 400 Å or less or 250 Å or more and 350 Å or less in some embodiments. In this case, the supply time of the C source greatly affects the pre-coating time, which causes an increase in the downtime of the substrate processing apparatus. Furthermore, if the thickness of the pre-coated film is set smaller than a thickness which falls within the aforementioned range, the film thickness drop phenomenon or particles may occur. In order to prevent the occurrence of both the film thickness drop phenomenon and particles, it may form a pre-coated film having a thickness of at least about 200 to 400 Å or about 250 to 350 Å in some embodiments.

In contrast, in the present embodiments, in order to suppress the occurrence of the film thickness drop phenomenon and particles, a pre-coated film having a total thickness of, for example, about 200 to 400 Å or about 250 to 350 Å in some embodiments, is formed in the process container. Furthermore, at that time, the SiON film is formed as the first pre-coated film and the SiOCN film is formed as the second pre-coated film thereon in the process container to form the pre-coated film having a total thickness of about 200 to 400 Å or about 250 to 350 Å in some embodiments in two steps in this way. As described above, by forming the pre-coated film in two steps and forming the SiON film which is a C-free film as the first pre-coated film, the process of supplying the C source whose supply time tends to be prolonged may be omitted in the process of forming the first pre-coated film. Thus, it is possible to increase the deposition rate and to shorten the pre-coating time accordingly.

It may also be considered here that the SiN film is formed as the first pre-coated film, but the film stress of the SiN film is larger than the film stress of the SiON film, and the film stress of the SiON film is larger than the film stress of the SiOCN film. That is, the SiN film has a larger film stress than that of the SiON film and the SiOCN film, and thus, the film is likely to be cracked and delaminated, leading to the generation of particles. Therefore, by using the SiON film having a film stress smaller than that of the SiN film and close to the film stress of the SiOCN film as the first pre-coated film, it is possible to shorten the pre-coating time while suppressing the generation of cracks in the pre-coated film and the delamination of the pre-coated film.

Furthermore, in the present embodiments, by setting the thickness (first thickness) of the first pre-coated film which can be formed at a relatively high deposition rate larger than the thickness (second thickness) of the second pre-coated film which is formed at a relatively low deposition rate, in other words, by setting the thickness (second thickness) of the second pre-coated film which is formed at a relatively low deposition rate smaller than the thickness (first thickness) of the first pre-coated film which can be formed at a relatively high deposition rate, it is possible to further shorten the pre-coating time and to further shorten the downtime of the apparatus.

(b) By setting the thickness (second thickness) of the second pre-coated film at a thickness of more than 25 Å, which is a thickness at which the second pre-coated film is pinhole-free, it is possible to suppress the occurrence of variation in the C concentration of the SiOCN film formed on the wafer, i.e., the film composition. As a result, it is possible to improve the quality of the film-forming process.

In this case, if the thickness of the second pre-coated film (SiOCN film) is too small, specifically, if the thickness of the second pre-coated film is 25 Å or less, pinholes may be generated in the second pre-coated film. When the process of forming the SiOCN film on the wafer is performed in the state in which the pinholes are generated in the second pre-coated film, the composition of the SiOCN film formed on the wafer may be affected by the first pre-coated film (SiON film) which is an underlayer of the second pre-coated film. Specifically, when forming the SiOCN film on the wafer, C, which should be originally introduced into the SiOCN film formed on the wafer, may reach the pre-coated film through the pinholes of the second pre-coated film and may be absorbed by the first pre-coated film. In this case, the C concentration of the SiOCN film formed on the wafer may be lowered.

Furthermore, when the process of forming the SiOCN film on the wafer is repeated, the SiOCN film is further deposited on the second pre-coated film, and therefore, the effect of pinholes on the second pre-coated film is gradually reduced. However, this means that the degree of C absorption by the first pre-coated film may vary every time the process of forming the SiOCN film on the wafer is repeated, which leads to a variation in the C concentration of the SiOCN film formed on the wafer, i.e., the film composition.

This problem can be solved by setting the thickness of the second pre-coated film at a thickness at which the second pre-coated film is pinhole-free, i.e., by setting the thickness of the second pre-coated film at a thickness of more than 25 Å. Furthermore, by setting the thickness of the second pre-coated film to 30 Å or more, it is possible to reliably solve the problem.

(c) By setting the thickness (second thickness) of the second pre-coated film to 150 Å or less, it is possible to secure a practical pre-coating time shortening effect and to achieve a practical downtime shortening effect. If the thickness of the second pre-coated film is too large, specifically, if the thickness of the second pre-coated film is set to more than 150 Å, the pre-coating time shortening effect may be reduced, and the downtime shortening effect may be reduced. By setting the thickness of the second pre-coated film to 150 Å or less, it is possible to solve the problem. By setting the thickness of the second pre-coated film to 100 Å or less, it is possible to reliably solve the problem. By setting the thickness of the second pre-coated film to 50 Å or less, it is possible to more reliably solve the problem. Moreover, these are particularly effective when forming the pre-coated film having a total thickness of, for example, about 200 to 400 Å or about 250 to 350 Å in some embodiments.

(d) By allowing both the first pre-coated film (SiON film) and the second pre-coated film (SiOCN film) to contain no elements other than the elements contained in the film (SiOCN film) formed on the wafer, it is possible to use the processing gas in the film-forming process in each pre-coating and it is not required to add the gas supply system for performing the pre-coating. Thus, it is possible to reduce the cost of the apparatus.

(e) By making the supply order of the Si source, the O source, and the N source in the first pre-coating and the supply order of the Si source, the C source, the O source, and the N source in the second pre-coating equal to the supply order of the Si source, the C source, the O source, and the N source in the film formation, it is possible to make the composition of the pre-coated film formed in the process container close to the composition of the film formed on the wafer 200. Thus, it is possible to more stabilize the C concentration of the SiOCN film formed on the wafer, i.e., the film composition.

(f) By performing the pre-coating process after the cleaning process and performing the film-forming process after the pre-coating process, it is possible to adjust the environments and conditions in the process container before the film formation. Furthermore, it is possible to suppress the generation of particles and the occurrence of film thickness drop phenomenon in the process container. As a result, it becomes possible to improve the quality of the film-forming process performed in the process container. Moreover, it is needless to say that, by performing the cleaning process and the pre-coating process in a state in which the empty boat is loaded into the process container, it is possible to perform the cleaning process and the pre-coating process even on the surface of the boat, and to achieve the same effects as those described above.

(g) The effects of the present embodiments can be similarly achieved in the case where a precursor gas other than the HCDS gas is used, or in the case where a C-containing gas other than the $C_3H_6$ gas is used, or in the case where an O-containing gas other than the $O_2$ gas is used, or in the case where a N- and H-containing gas other than the $NH_3$ gas is used, or in the case where a cleaning gas other than the $F_2$ gas is used, or in the case where an additive gas other than the NO gas is used, or in the case where an inert gas other than the $N_2$ gas is used.

Other Embodiments of the Present Disclosure

While one embodiments of the present disclosure has been specifically described above, the present disclosure is not limited to the aforementioned embodiments but may be variously modified without departing from the spirit of the present disclosure.

In the aforementioned embodiments, the processing sequence of sequentially performing film formation, chamber cleaning, first nozzle cleaning, second nozzle cleaning, first pre-coating, second pre-coating, and film formation has been illustrated, but any step of chamber cleaning, first nozzle cleaning, and second nozzle cleaning may not be performed, as illustrated in (1) to (6) below. Even in these cases, the same effects as those of the aforementioned embodiments described with reference to FIGS. 4 and 5 may be achieved.

(1) Film formation→chamber cleaning→first pre-coating→second pre-coating→film formation (2) Film formation→first nozzle cleaning→second nozzle cleaning→first pre-coating→second pre-coating→film formation (3) First pre-coating→second pre-coating→film formation (4) Chamber cleaning→first nozzle cleaning→second nozzle cleaning→first pre-coating→second pre-coating-→film formation (5) Chamber cleaning→first pre-coating→second pre-coating→film formation (6) First nozzle cleaning→second nozzle cleaning→first pre-coating→second pre-coating→film formation Furthermore, in the film formation, films may be formed on the wafer 200 by the gas supply sequences illustrated below. Even in these cases, by making the supply order of each source in the first pre-coating and the second pre-coating equal to that of each source in the film formation and applying the method of the present disclosure, the same effects as those of the aforementioned embodiments described with reference to FIGS. 4 and 5 may be achieved. The C-containing gas such as the $C_3H_6$ gas is not limited as being supplied from the gas supply pipe 232a and the nozzle 249a but may be supplied from the gas supply pipe 232b and the nozzle 249b. Even in this case, the same effects as those of the aforementioned embodiments described with reference to FIGS. 4 and 5 may be achieved.

$(HCDS \rightarrow C_3H_6 \rightarrow NH_3 \rightarrow O_2) \times n \Rightarrow SiOCN$ $(HCDS \rightarrow NH_3 \rightarrow C_3H_6 \rightarrow O_2) \times n \Rightarrow SiOCN$ $(HCDS \rightarrow NH_3 \rightarrow O_2 \rightarrow C_3H_6) \times n \Rightarrow SiOCN$ $(C_3H_6 \rightarrow HCDS \rightarrow C_3H_6 \rightarrow O_2 \rightarrow NH_3) \times n \Rightarrow SiOCN$ $(C_3H_6 \rightarrow HCDS \rightarrow C_3H_6 \rightarrow NH_3 \rightarrow O_2) \times n \Rightarrow SiOCN$ Recipes used in each processing may be prepared individually according to the processing contents and may be stored in the memory 121c via a telecommunication line or the external memory 123. Moreover, at the start of each processing, the CPU 121a may properly select an appropriate recipe from the recipes stored in the memory 121c according to the processing contents. Thus, it is possible for a single substrate processing apparatus to form films of different kinds, composition ratios, film qualities and film thicknesses with enhanced reproducibility. In addition, it is possible to reduce an operator's burden and to quickly start each processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiments, there has been described an example in which films are formed using a batch-type substrate processing apparatus capable of processing a plurality of substrates at a time. The present disclosure is not limited to the aforementioned embodiments but may be appropriately applied to, e.g., a case where films are formed using a single-wafer-type substrate processing apparatus capable of processing a single substrate or several substrates at a time. In addition, in the aforementioned embodiments, there has been described an example in which films are formed using the substrate processing apparatus provided with a hot-wall-type process furnace. The present disclosure is not limited to the aforementioned embodiments but may be appropriately applied to a case where films are formed using a substrate processing apparatus provided with a cold-wall-type process furnace.

In the case of using these substrate processing apparatuses, each processing may be performed by the processing procedures and processing conditions similar to those of the aforementioned embodiments. Effects similar to those of the aforementioned embodiments may be achieved.

The embodiments described above may be appropriately combined with one another. The processing procedures and processing conditions at this time may be similar to, for example, the processing procedures and processing conditions of the aforementioned embodiments.

EXAMPLES

Next, examples will be described.

Example 1

A pre-coated film having a thickness $TH_0$ (=250 to 350 Å) was formed in the process container including the inner wall of the reaction tube 203 under different pre-coating conditions, and the pre-coating times were compared.

Figure 6A:
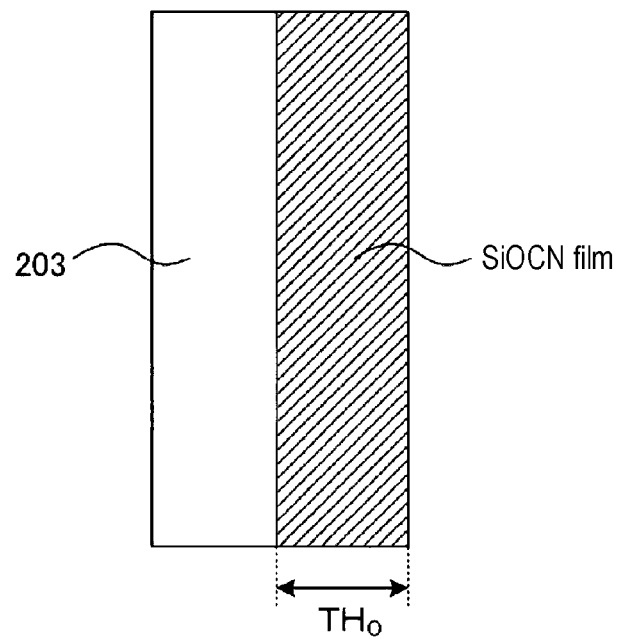
FIG. 6A is a schematic cross sectional view illustrating an inner wall of a reaction tube after pre-coating according to a comparative example.
Figure 6B:
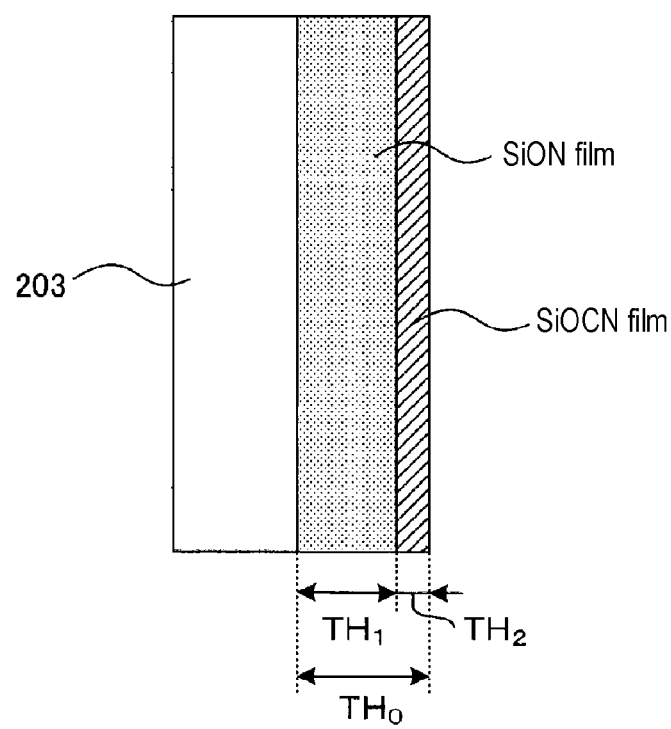
FIG. 6B is a schematic sectional view illustrating an inner wall of a reaction tube after pre-coating according to this example.
Figure 7:
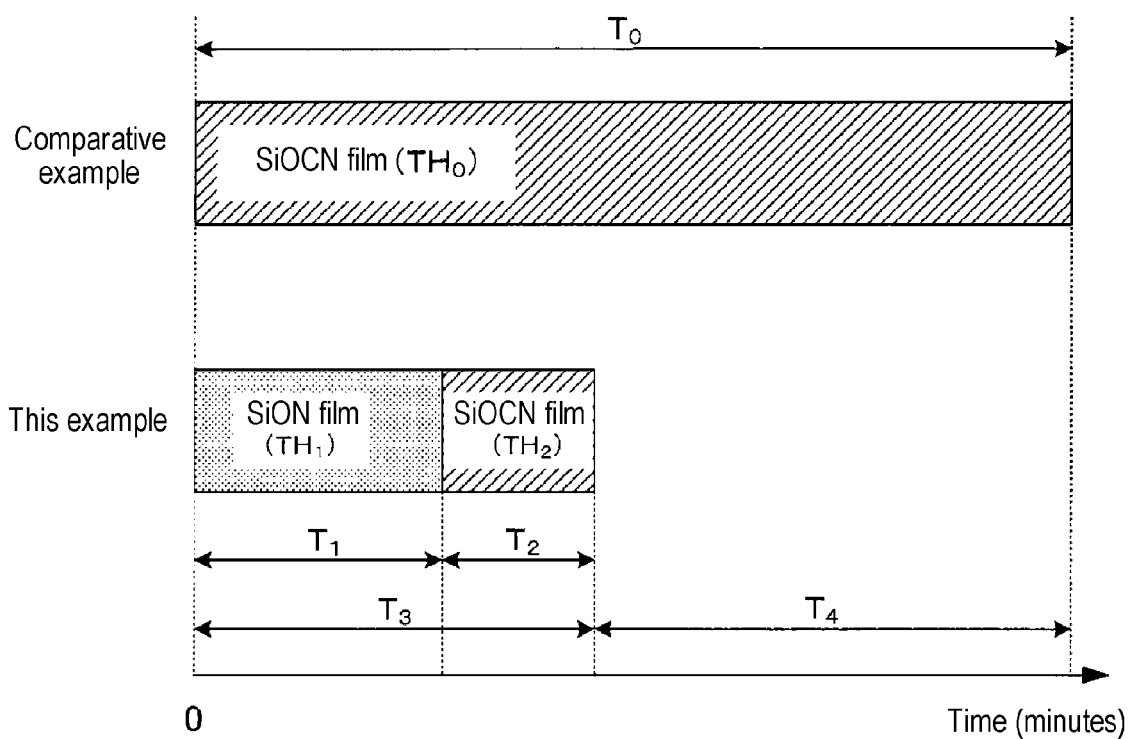
FIG. 7 is a view illustrating a comparison between a pre-coating time when a pre-coated film according to a comparative example is formed and a pre-coating time when a pre-coated film according to this example is formed.

In a comparative example, as shown in FIG. 6A, a SiOCN film having a thickness of $TH_0$ was formed as a pre-coated film in the process container including the inner wall of the reaction tube 203. In this example, as shown in FIG. 6B, a SiON film having a thickness $TH_1$ (=200 to 300 Å) and a SiOCN film having a thickness $TH_2$ (=30 to 50 Å) were formed as the pre-coated film in the process container including the inner wall of the reaction tube 203. The processing conditions were set to predetermined conditions which fall within the processing condition range in the aforementioned embodiments. FIG. 7 shows a pre-coating time in each of the comparative example and the example.

As shown in FIG. 7, in the comparative example, it took a time of $T_0$ (=600 to 750 minutes) to form the SiOCN film having the thickness $TH_0$ in the process container including the inner wall of the reaction tube 203. In contrast, as shown in FIG. 7, in this example, it took a time of $T_1$ (=150 to 200 minutes) to form the SiON film having the thickness $TH_1$ and it took $T_2$ (=50 to 100 minutes) to form the SiOCN film having the thickness $TH_2$ in the process container including the inner wall of the reaction tube 203, i.e., it took a time of $T_3$ (=200 to 300 minutes) to form the pre-coated film having the thickness $TH_0$. In other words, in this example, the pre-coating time could be shortened by $T_4$ (=400 to 450 minutes), i.e., about 60% or more, compared with the comparative example.

That is, it could be confirmed that the pre-coated film is formed by two layers of the SiON film and the thinner SiOCN film by performing the pre-coating in two steps as described above, whereby the pre-coating time can be significantly shortened and the downtime of the apparatus can be significantly reduced, compared with the case where the pre-coated film is formed by the SiOCN film alone.

Example 2

The characteristics of films formed on the wafer by first film formation after forming the pre-coated film in each process container in which the pre-coated film was formed under different pre-coating conditions in example 1 were compared.

In a comparative example, a film was formed on the wafer by the first film formation after forming the pre-coated film in the process container in which the pre-coated film was formed by the method of the comparative example in example 1. In this example, a film was formed on the wafer by the first film formation after forming the pre-coated film in the process container in which the pre-coated film was formed by the method of the example in example 1. The processing procedures and processing conditions in the first film formation after forming the pre-coated film were set similar to the comparative example and the example. FIGS. 8A to 8F show various characteristics of a film formed in each of the comparative example and the example.

Figure 8A:
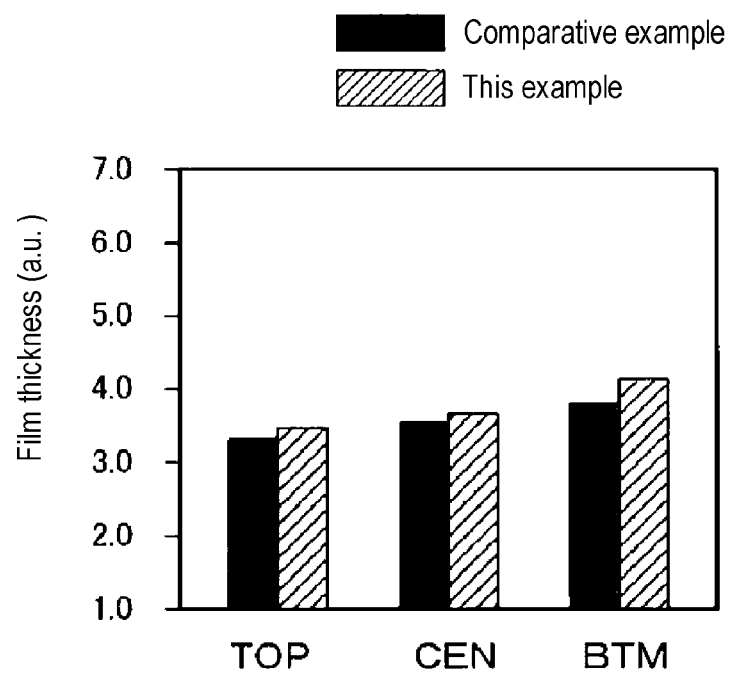
FIG. 8A is a view illustrating a thickness of a film formed on a substrate arranged in each of top (TOP), center (CEN), and bottom (BTM) by first film formation after pre-coating by comparison between the comparative example and this example.

FIG. 8A is a view showing a thickness of a film formed on a wafer arranged in each of top (TOP), center (CEN), and bottom (BTM) by the first film formation after pre-coating, by comparison between the comparative example and this example. As shown in FIG. 8A, it was confirmed that the thickness of the film formed in this example is equivalent to the thickness of the film formed in the comparative example, and the film thickness drop phenomenon does not occur in any of them.

Figure 8B:
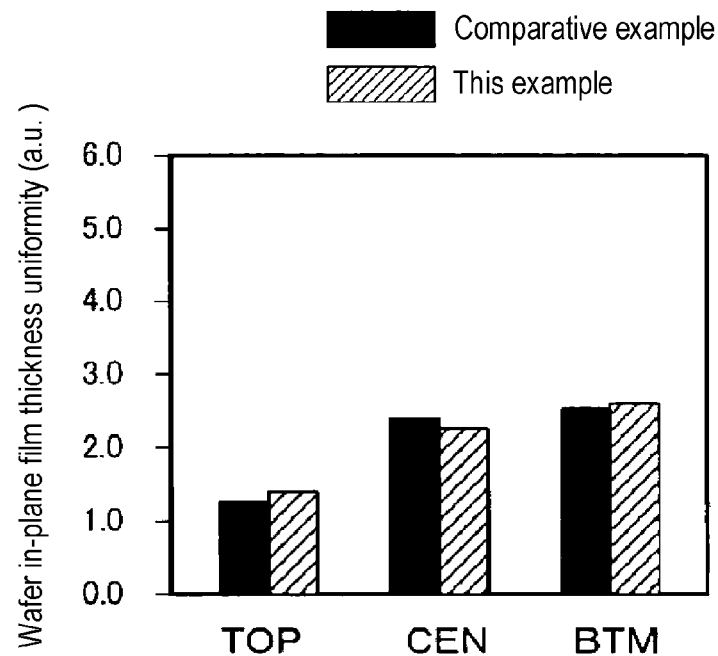
FIG. 8B is a view illustrating a wafer in-plane film thickness uniformity of the film formed on the substrate arranged in each of TOP, CEN, and BTM by the first film formation after pre-coating by comparison between the comparative example and this example.

FIG. 8B is a view showing a wafer in-plane film thickness uniformity of the film formed on the wafer arranged in each of TOP, CEN, and BTM by the first film formation after pre-coating, by comparison between the comparative example and this example. As shown in FIG. 8B, it was confirmed that the wafer in-wafer film thickness uniformity of the film formed in this example is equivalent to the wafer in-wafer film thickness uniformity of the film formed in the comparative example.

Figure 8C:
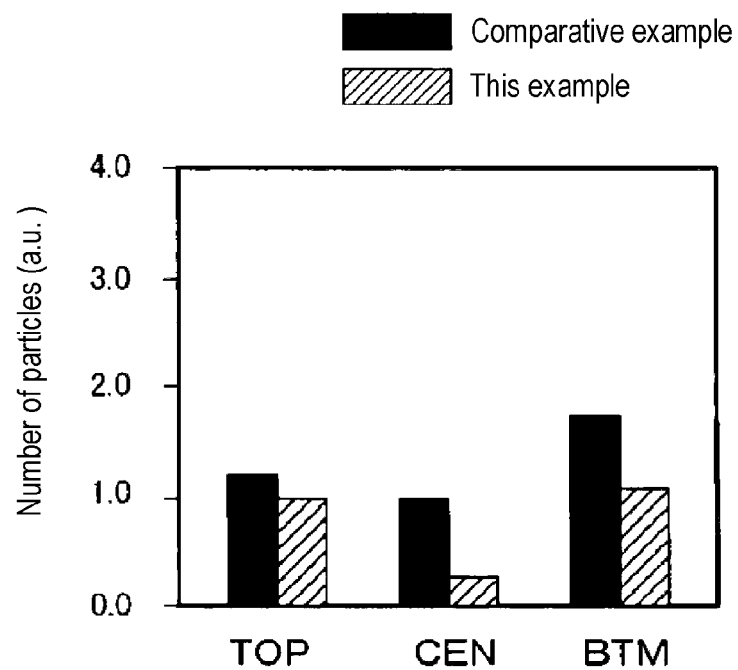
FIG. 8C is a view illustrating a number of particles adhered to the film formed on the substrate arranged in each of TOP, CEN, and BTM by the first film formation after pre-coating by comparison between the comparative example and this example.

FIG. 8C is a view showing a number of particles having a size of 32 nm or more adhered to the film formed on the wafer arranged on each of TOP, CEN, and BTM by the first film formation after pre-coating, by comparison between the comparative example and this example. As shown in FIG. 8C, it was confirmed that the number of particles adhered to the film formed in this example is smaller than the number of particles adhered to the film formed in the comparative example, which is excellent in each region.

Figure 8D:
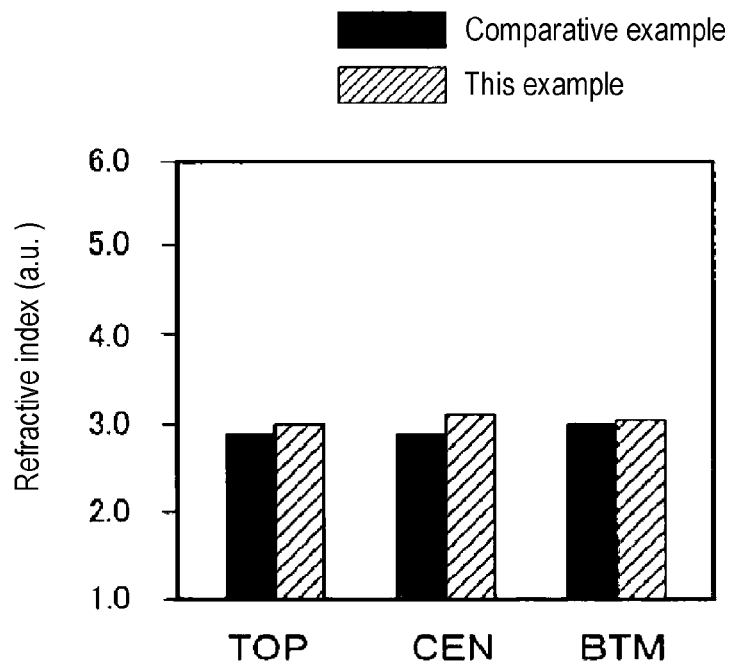
FIG. 8D is a view illustrating a refractive index of the film formed on the substrate arranged in each of TOP, CEN, and BTM by the first film formation after pre-coating by comparison between the comparative example and this example.

FIG. 8D is a view showing a refractive index of the film formed on the wafer arranged in each of TOP, CEN, and BTM by the first film formation after pre-coating, by comparison between the comparative example and this example. As shown in FIG. 8D, it was confirmed that the refractive index of the film formed in this example is equivalent to the refractive index of the film formed in the comparative example.

Figure 8E:
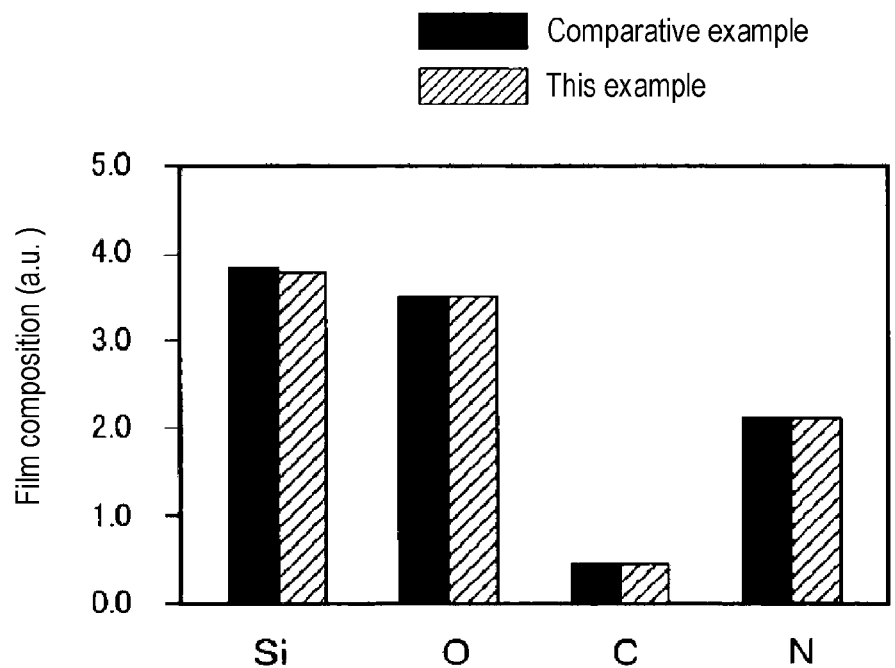
FIG. 8E is a view illustrating a composition ratio of the film formed on the substrate by the first film formation after pre-coating by comparison between the comparative example and this example.

FIG. 8E is a view showing a composition ratio of the film formed on the wafer by the first film formation after pre-coating, by comparison between the comparative example and this example. That is, FIG. 8E is a view showing an atomic concentration of Si, O, C, and N, i.e., a composition ratio, of the film formed in each of the comparative example and this example. As shown in FIG. 8E, it was confirmed that the composition ratio of the film formed in this example is equivalent to the composition ratio of the film formed in the comparative example.

Figure 8F:
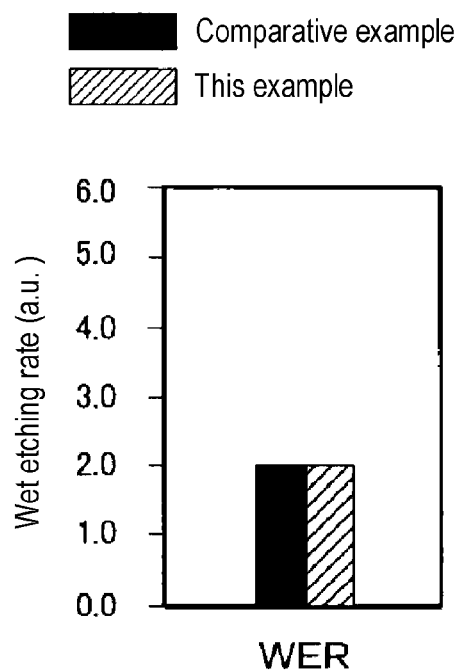
FIG. 8F is a view illustrating a wet etching rate of the film formed on the substrate by the first film formation after pre-coating by comparison between the comparative example and this example.

FIG. 8F shows a wet etching rate when the film formed on the wafer by the first film formation after pre-coating is immersed in a 1% HF aqueous solution, by comparison between the comparative example and the present example. As shown in FIG. 8F, it was confirmed that the wet etching rate of the film formed in this example is equivalent to the wet etching rate of the film formed in the comparative example.

That is, it was confirmed that, even when the film was formed on the wafer by the method of this example, it is possible to obtain the film having the same quality as when the film was formed on the wafer by the method of the comparative example.

According to the present disclosure in some embodiments, it is possible to improve a productivity by shortening a downtime of a substrate processing apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    (a) forming a film on a substrate by supplying a first processing gas to the substrate in a process container;
    (b) forming a first pre-coated film, which is an oxynitride film having a first thickness and having a material different from a material of the film formed in (a), in the process container by supplying a second processing gas into the process container in a state in which the substrate does not exist in the process container; and
    (c) forming a second pre-coated film, which is an oxy-carbonitride film having a second thickness smaller than the first thickness and having the same material as the material of the film formed in (a), on the first pre-coated film formed in the process container by supplying a third processing gas into the process container in the state in which the substrate does not exist in the process container.

2. The method according to claim 1, wherein both the first pre-coated film and the second pre-coated film contain no element other than elements contained in the film formed in (a).

3. The method according to claim 1, wherein the first pre-coated film is a carbon-free film, and the second pre-coated film is a carbon-containing film.

4. The method according to claim 1, wherein the film formed in (a) contains silicon, oxygen, carbon, and nitrogen, the first pre-coated film contains silicon, oxygen, and nitrogen, and the second pre-coated film contains silicon, oxygen, carbon, and nitrogen.

5. The method according to claim 1, wherein the film formed in (a) is a silicon oxycarbonitride film, the first pre-coated film is a silicon oxynitride film, and the second pre-coated film is a silicon oxycarbonitride film.

6. The method according to claim 1, wherein in (b), the first pre-coated film is formed by performing a cycle a predetermined number of times, the cycle including non-simultaneously supplying a silicon-containing gas, an oxygen-containing gas, and a nitrogen-containing gas as the second processing gas into the process container, and wherein in (c), the second pre-coated film is formed by performing a cycle a predetermined number of times, the cycle including non-simultaneously supplying a silicon-containing gas, a carbon-containing gas, an oxygen-containing gas, and a nitrogen-containing gas as the third processing gas into the process container.

7. The method according to claim 6, wherein in (a), the film formed in (a) is formed by performing a cycle a predetermined number of times, the cycle including non-simultaneously supplying a silicon-containing gas, a carbon-containing gas, an oxygen-containing gas, and a nitrogen-containing gas as the first processing gas to the substrate in the process container, and wherein a supply order of the silicon-containing gas, the oxygen-containing gas, and the nitrogen-containing gas in (b) and a supply order of the silicon-containing gas, the carbon-containing gas, the oxygen-containing gas, and the nitrogen-containing gas in (c) are set equal to a supply order of the silicon-containing gas, the carbon-containing gas, the oxygen-containing gas, and the nitrogen-containing gas in (a).

8. The method according to claim 7, wherein in (a), the silicon-containing gas, the carbon-containing gas, the oxygen-containing gas, and the nitrogen-containing gas are sequentially supplied in this order, wherein in (b), the silicon-containing gas, the oxygen-containing gas, and the nitrogen-containing gas are sequentially supplied in this order, and wherein in (c), the silicon-containing gas, the carbon-containing gas, the oxygen-containing gas, and the nitrogen-containing gas are sequentially supplied in this order.

9. The method according to claim 1, wherein the second thickness is a thickness at which the second pre-coated film is pinhole-free.

10. The method according to claim 1, wherein the second thickness is more than 25 Å and 150 Å or less.

11. The method according to claim 1, wherein the second thickness is 30 Å or more and 100 Å or less.

12. The method according to claim 1, wherein the second thickness is 30 Å or more and 50 Å or less.

13. The method according to claim 1, wherein after (b) and (c) are performed, (a) is performed.

14. The method according to claim 1, further comprising: (d) removing deposits deposited in the process container by supplying a cleaning gas into the process container in the state in which the substrate does not exist in the process container, before performing (b) and (c).

15. The method according to claim 14, wherein (d), (b), and (c) are sequentially performed in this order, and then, (a) is performed.

16. The method according to claim 14, wherein after (a) is performed, (d), (b), and (c) are sequentially performed in this order.

17. The method according to claim 14, wherein after (a) is performed, (d), (b), and (c) are sequentially performed in this order, and then, (a) is performed.

18. A substrate processing apparatus, comprising:
a process container in which a substrate is processed;
a first processing gas supply system configured to supply a first processing gas into the process container;
a second processing gas supply system configured to supply a second processing gas into the process container;
a third processing gas supply system configured to supply a third processing gas into the process container; and
a controller configured to be capable of controlling the first processing gas supply system, the second processing gas supply system, and the third processing gas supply system so as to perform a process, the process comprising:
  (a) forming a film on the substrate by supplying the first processing gas to the substrate in the process container;
  (b) forming a first pre-coated film, which is an oxynitride film having a first thickness and having a material different from a material of the film formed in (a), in the process container by supplying the second processing gas into the process container in a state in which the substrate does not exist in the process container; and
  (c) forming a second pre-coated film, which is an oxycarbonitride film having a second thickness smaller than the first thickness and having the same material as the material of the film formed in (a), on the first pre-coated film formed in the process container by supplying the third processing gas into the process container in the state in which the substrate does not exist in the process container.

19. A non-transitory computer-readable recording medium storing a program that causes, by a computer, a substrate processing apparatus to perform a process, the process comprising:
  (a) forming a film on a substrate by supplying a first processing gas to the substrate in a process container of the substrate processing apparatus;
  (b) forming a first pre-coated film, which is an oxynitride film film having a first thickness and having a material different from a material of the film formed in (a), in the process container by supplying a second processing gas into the process container in a state in which the substrate does not exist in the process container; and
  (c) forming a second pre-coated film, which is an oxycarbonitride film having a second thickness smaller than the first thickness and having the same material as the material of the film formed in (a), on the first pre-coated film formed in the process container by supplying a third processing gas into the process container in the state in which the substrate does not exist in the process container.

20. A method of processing a substrate, comprising:
(a) forming a film on the substrate by supplying a first processing gas to the substrate in a process container;
(b) forming a first pre-coated film, which is an oxynitride film having a first thickness and having a material different from a material of the film formed in (a), in the process container by supplying a second processing gas into the process container in a state in which the substrate does not exist in the process container; and
(c) forming a second pre-coated film, which is an oxycarbonitride film having a second thickness smaller than the first thickness and having the same material as the material of the film formed in (a), on the first pre-coated film formed in the process container by supplying a third processing gas into the process container in the state in which the substrate does not exist in the process container.

\* \* \* \* \*